United States Patent
Hashemi et al.

(10) Patent No.: US 9,341,942 B2
(45) Date of Patent: May 17, 2016

(54) VACUUM CHAMBER ASSEMBLY FOR SUPPORTING A WORKPIECE

(75) Inventors: Fardad Hashemi, Moraga, CA (US); Douglas C. Watson, Campbell, CA (US); Lorri L. Watson, legal representative, Campbell, CA (US)

(73) Assignee: Nikon Research Corporation of America, Belmont, CA (US)

( * ) Notice: Subject to any disclaimer, the term of this patent is extended or adjusted under 35 U.S.C. 154(b) by 255 days.

(21) Appl. No.: 13/818,567

(22) PCT Filed: Aug. 23, 2011

(86) PCT No.: PCT/US2011/048862
§ 371 (c)(1),
(2), (4) Date: Feb. 22, 2013

(87) PCT Pub. No.: WO2012/027406
PCT Pub. Date: Mar. 1, 2012

(65) Prior Publication Data
US 2013/0155385 A1    Jun. 20, 2013

Related U.S. Application Data

(60) Provisional application No. 61/376,496, filed on Aug. 24, 2010.

(51) Int. Cl.
*G03F 7/20* (2006.01)
*G03F 1/64* (2012.01)
(Continued)

(52) U.S. Cl.
CPC *G03F 1/64* (2013.01); *G03B 27/64* (2013.01); *G03F 1/66* (2013.01); *G03F 7/70841* (2013.01); *G03F 7/70908* (2013.01); *H01L 21/6719* (2013.01)

(58) Field of Classification Search
CPC . G03B 27/64; G03F 7/70841; G03F 7/70908; G03F 7/70983; G03F 7/70916; G03F 1/64; G03F 1/62; H01L 21/6719
USPC .............................................. 417/472; 92/34
See application file for complete search history.

(56) References Cited

U.S. PATENT DOCUMENTS

| | | |
|---|---|---|
| 3,759,662 A | 9/1973 | Bengel et al. |
| 4,229,655 A | 10/1980 | Ryding |

(Continued)

FOREIGN PATENT DOCUMENTS

| | | | |
|---|---|---|---|
| JP | 05-291112 | * | 11/1993 |
| JP | 2004-95653 A | | 3/2004 |

OTHER PUBLICATIONS

International Search Report of Apr. 20, 2012 for PCT/US2011/048862 (parent application).

(Continued)

*Primary Examiner* — Steven H Whitesell Gordon
(74) *Attorney, Agent, or Firm* — Roeder & Broder LLP; Steven G. Roeder

(57) ABSTRACT

A chamber assembly (26) for providing a sealed chamber (40) adjacent to a workpiece (28) to counteract the influence of gravity on the workpiece (28) includes a chamber housing (244), and a seal assembly (33) that expands and/or contracts to better seal against the workpiece (28). Further, the chamber assembly (26) can include one or more transducer assemblies (34) that expand or contract to quickly respond to leaks or injections of fluid in chamber assembly (26) to maintain a constant and stable chamber pressure in the chamber assembly (26). Moreover, the chamber assembly (26) can utilize a pressure source (35) that directs a lager amount of fluid (374) through a fluid passageway (368) to accurately maintain the pressure within the chamber assembly (26).

19 Claims, 15 Drawing Sheets

(51) Int. Cl.
  *G03F 1/66*  (2012.01)
  *H01L 21/67* (2006.01)
  *G03B 27/64* (2006.01)

(56) References Cited

U.S. PATENT DOCUMENTS

| | | | |
|---|---|---|---|
| 4,803,712 A * | 2/1989 | Kembo et al. | 378/34 |
| 4,833,051 A * | 5/1989 | Imamura | 430/5 |
| 6,222,603 B1 | 4/2001 | Sakai | |
| 6,226,133 B1 * | 5/2001 | Osakabe | 359/811 |
| 6,323,494 B1 | 11/2001 | Lee | |
| 6,333,775 B1 | 12/2001 | Haney et al. | |
| 6,492,067 B1 * | 12/2002 | Klebanoff et al. | 430/5 |
| 6,542,220 B1 * | 4/2003 | Schrijver et al. | 355/53 |
| 6,600,547 B2 | 7/2003 | Watson | |
| 6,914,663 B2 * | 7/2005 | Hara | 355/30 |
| 7,607,543 B2 * | 10/2009 | Gregerson et al. | 206/710 |
| 7,717,966 B2 | 5/2010 | Watson | |
| 2002/0030799 A1 * | 3/2002 | Iwasaki et al. | 355/53 |
| 2004/0057031 A1 * | 3/2004 | Hara | 355/53 |
| 2005/0274910 A1 * | 12/2005 | Desai et al. | 250/492.21 |
| 2005/0286032 A1 * | 12/2005 | Lof et al. | 355/53 |
| 2009/0059190 A1 * | 3/2009 | Tanaka et al. | 355/30 |
| 2010/0245795 A1 | 9/2010 | Hashemi | |
| 2011/0240224 A1 * | 10/2011 | Yoshimura et al. | 156/345.47 |

OTHER PUBLICATIONS

International Preliminary Report on Patentability of Mar. 7, 2013 for PCT/US2011/048862 (parent application).

* cited by examiner

VACUUM CHAMBER ASSEMBLY FOR SUPPORTING A WORKPIECE

RELATED APPLICATION

The application claims priority on Provisional Application Ser. No. 61/376,496 filed on Aug. 24, 2010, entitled "LCD ANTI-GRAVITY MASK SYSTEM". As far as is permitted, the contents of Provisional Application Ser. No. 61/376,496 are incorporated herein by reference.

BACKGROUND

Exposure apparatuses are commonly used to transfer images from a reticle onto a substrate during the manufacturing and processing of liquid crystal displays ("LCDs") and semiconductor wafers. There is a never ending desire to manufacture larger LCDs. Typically, larger masks are required to manufacture larger LCDs. Unfortunately, as the size of the masks utilized increases, so does the likelihood that the mask may be subject to a certain amount of sagging due to gravity in the middle region of the mask that is not directly supported. Accordingly, there is a need to develop a system whereby the potential sagging of the mask is minimized while inhibiting unwanted blocking of the pattern on the mask.

SUMMARY

The present invention is directed to a chamber assembly for providing a sealed chamber adjacent to a workpiece (e.g. a mask) to support the workpiece. The chamber assembly is substantially surrounded by an environment having an environmental pressure. For example, the environmental pressure can be at atmospheric pressure. The chamber assembly can include a chamber housing that is positioned spaced apart by a chamber gap from the workpiece, and a seal assembly that seals the chamber gap to form the sealed chamber adjacent to the workpiece. In certain embodiments, the seal assembly includes a flexible barrier that is secured to the chamber housing, and a compliant seal that is secured to the flexible barrier. With this design, the flexible barrier expands or contracts to adjust for changes in the chamber gap, and the compliant seal engages the workpiece to seal non-uniformities in the workpiece without distorting the workpiece.

In one embodiment, the flexible barrier is relatively stiff along a first axis, along a second axis, and about a third axis, and is flexible along the third axis, about the first axis, and about the second axis (e.g. vertically flexible). In this embodiment, the chamber housing is spaced apart from the workpiece along the third axis.

As provided herein, the chamber assembly can include a pressure source that is in fluid communication with the sealed chamber for controlling a chamber pressure within the sealed chamber so that the chamber pressure is lower than the environmental pressure. In certain embodiments, the pressure source directs a relatively large enough amount of fluid through a relatively large fluid passageway to control the chamber pressure adjacent to the workpiece. With this design, the pressure source can create a small stable vacuum in the sealed chamber.

In certain embodiments, the pressure source can include a variable restrictor that selectively restricts fluid flow in the fluid passageway to selectively control the chamber pressure in the sealed chamber. Additionally, or alternatively, the pressure source can include a source motor that can be selectively controlled to control the fluid flow in the fluid passageway and control the chamber pressure in the sealed chamber.

In yet another embodiment, the assembly can include a workpiece stage assembly that moves the workpiece, and a source mover assembly that moves the pressure source substantially concurrently with the workpiece stage assembly. With this design, the source mover assembly can be controlled so that the pressure source is moved to substantially follow the movement of the workpiece.

In still another embodiment, the chamber assembly can include a first connector tube that connects the pressure source in fluid communication with the sealed chamber, and a second connector tube that also connects the pressure source in fluid communication with the sealed chamber.

Additionally, or alternatively, the chamber assembly can include a transducer assembly that is in fluid communication with the sealed chamber. In this embodiment, the transducer assembly expands or contracts as needed to compensate for pressure variations in the sealed chamber due to leaks or injections, thereby stabilizing the pressure in the sealed chamber.

Further, the present invention is also directed to a stage assembly, an exposure apparatus, a method for providing a sealed chamber adjacent to a workpiece, a method for manufacturing an exposure apparatus, and a method for manufacturing a device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
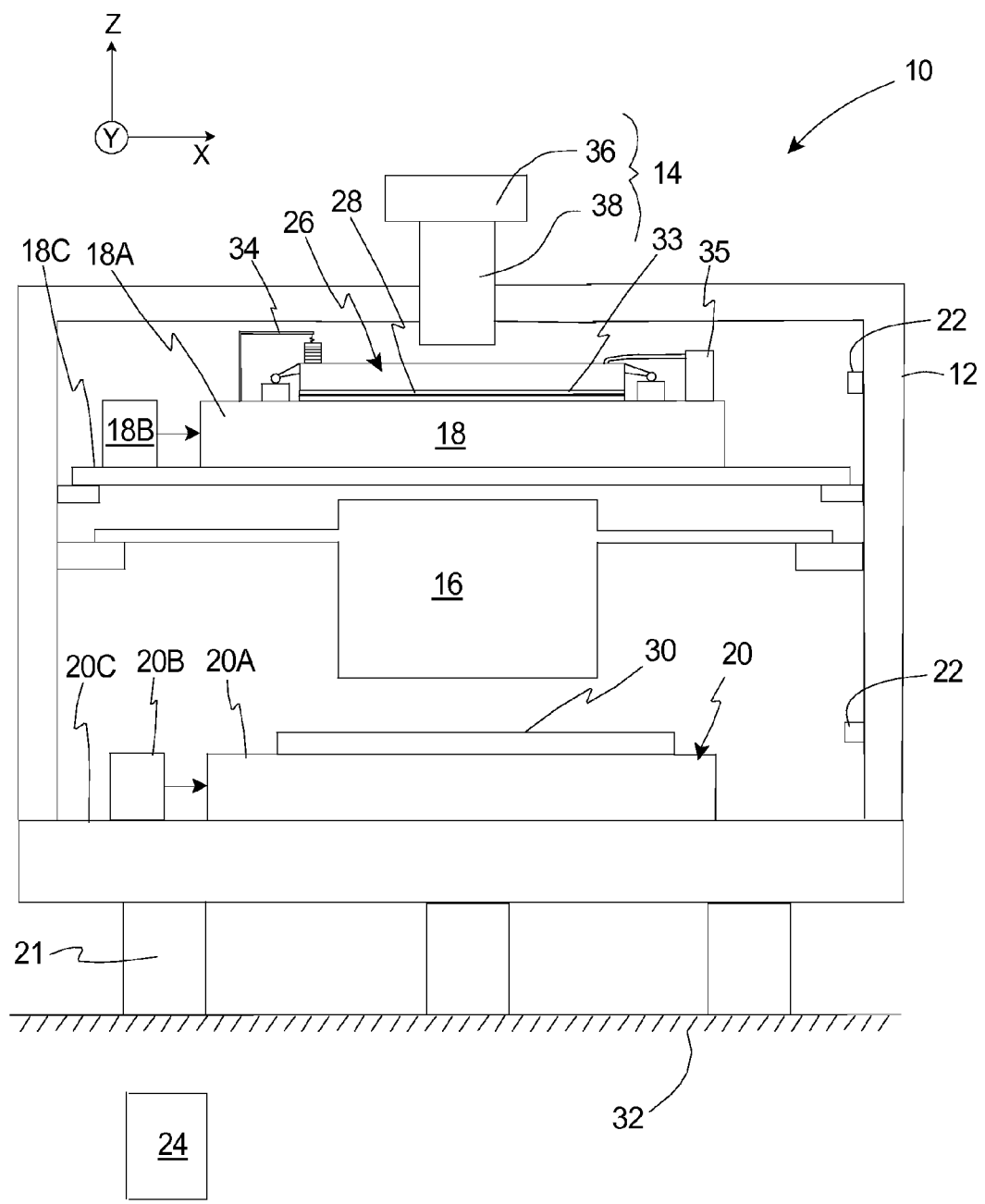
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a first stage assembly 18, a second stage assembly 20, a measurement system 22, a control system 24, and a chamber assembly 26. The design of the components of the exposure apparatus 10 can be varied to suit the design requirements of the exposure apparatus 10.

In one embodiment, the exposure apparatus 10 is particularly useful as a lithographic device that transfers a pattern (not shown) of a liquid crystal display (LCD) device from a workpiece 28 (e.g., an LCD mask) onto a substrate 30. In this embodiment, the workpiece 28 is at least partly transparent.

However, the use of the exposure apparatus 10 provided herein is not limited to an LCD photolithography system that exposes a liquid crystal display device pattern from the mask 28 onto a rectangular glass plate, i.e. the substrate 30. The exposure apparatus 10, for example, can be used as a photolithography system for semiconductor manufacturing or a photolithography system for manufacturing a thin film magnetic head. Further, the present invention can also be applied to a proximity photolithography system that exposes a mask pattern from a mask to a substrate with the mask located close to the substrate without the use of a lens assembly. It should be noted that in certain embodiments, flatness and pressure specifications may be tighter for proximity lithography.

In FIG. 1, the exposure apparatus 10 mounts to a mounting base 32, e.g., the ground, a base, or floor or some other supporting structure.

As an overview, in certain embodiments, the chamber assembly 26 is uniquely designed to counteract the influence of gravity on the workpiece 28 and inhibit sagging of the workpiece 28. For example, in certain embodiments, the chamber assembly 26 includes a unique seal assembly 33 that expands and/or contracts to better seal against the workpiece 28. Further, in certain embodiments, the chamber assembly 26 includes one or more unique transducer assemblies 34 (only one is illustrated in FIG. 1) that quickly responds to leaks or injections of fluid in chamber assembly 26 to maintain a constant and stable chamber pressure in the chamber assembly 26 to accurately maintain the shape of the workpiece 28. Moreover, in certain embodiments, the chamber assembly 26 utilizes a unique pressure source 35 (illustrated as a box in FIG. 1) that accurately maintains the pressure within the chamber assembly 26 to accurately maintain the shape of the workpiece 28. Still further, the present invention includes other unique features that allow the chamber assembly 26 to support the workpiece 28 with improved accuracy.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The apparatus frame 12 is rigid and supports the components of the exposure apparatus 10. The apparatus frame 12 illustrated in FIG. 1 supports the first stage assembly 18, the optical assembly 16 and the illumination system 14 above the mounting base 32.

The illumination system 14 includes an illumination source 36 and an illumination optical assembly 38. The illumination source 36 emits a beam (irradiation) of light energy. The illumination optical assembly 38 guides the beam of light energy from the illumination source 36 to the mask 28. The beam selectively illuminates different portions of the workpiece 28 and exposes the substrate 30. In an alternative embodiment, the illumination system 14 may include more than one illumination source 36 and more than one illumination optical assembly 38 to compensate for the relatively large size of the mask 28.

The optical assembly 16 projects and/or focuses the light passing through the workpiece 28 to the substrate 30. Depending upon the design of the exposure apparatus 10, the optical assembly 16 can magnify or reduce the image illuminated on the workpiece 28. The optical assembly 16 need not be limited to a reduction system. It could also be a 1× or magnification system.

The first stage assembly 18 holds and positions the workpiece 28 relative to the optical assembly 16 and the substrate 30. Further, in certain embodiments, the first stage assembly 18 concurrently moves at least a portion of the chamber assembly 26 with the workpiece 28. The first stage assembly 18 can include a first stage 18A that includes a chuck that retains the workpiece 28 and a portion of the chamber assembly 26, a first stage mover 18B that moves the first stage 18A with one or more degrees of movement, and a first stage base 18C that supports the first stage 18A.

Somewhat similarly, the second stage assembly 20 holds and positions the substrate 30 with respect to the projected image of the illuminated portions of the mask 28. The second stage assembly 20 can include a second stage 20A that retains the substrate 30, a second stage mover 20B that moves the second stage 20A with one or more degrees of movement, and a second stage base 20C that supports the second stage 20A. The second stage base 20C is supported by a vibration isolating system 21. It should be noted that other types of stages can be utilized.

The measurement system 22 monitors movement of the mask 28 and the substrate 30 relative to the optical assembly 16 or some other reference. With this information, the control system 24 can control the first stage assembly 18 to precisely position the mask 28 and the second stage assembly 20 to precisely position the substrate 30. For example, the measurement system 22 can utilize multiple laser interferometers, encoders, and/or other measuring devices.

The control system 24 is connected to the first stage assembly 18, the second stage assembly 20, and the measurement system 22. The control system 24 receives information from the measurement system 22 and controls the stage assemblies 18, 20 to precisely position the mask 28 and the substrate 30. Additionally, the control system 24 can control the operation of the one or more transducer assemblies 34 and/or the pressure source 35. The control system 24 can include one or more processors and circuits.

The chamber assembly 26 provides a sealed chamber 40 (illustrated in FIG. 2) adjacent to the mask 28. Additionally, the chamber assembly 26 controls the environment within the sealed chamber 40. The desired environment created and/or controlled within the sealed chamber 40 by the chamber assembly 26 can be selected according to the design of the rest of the components of the exposure apparatus 10. For example, the desired controlled environment within the sealed chamber 40 can be a low vacuum type environment.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
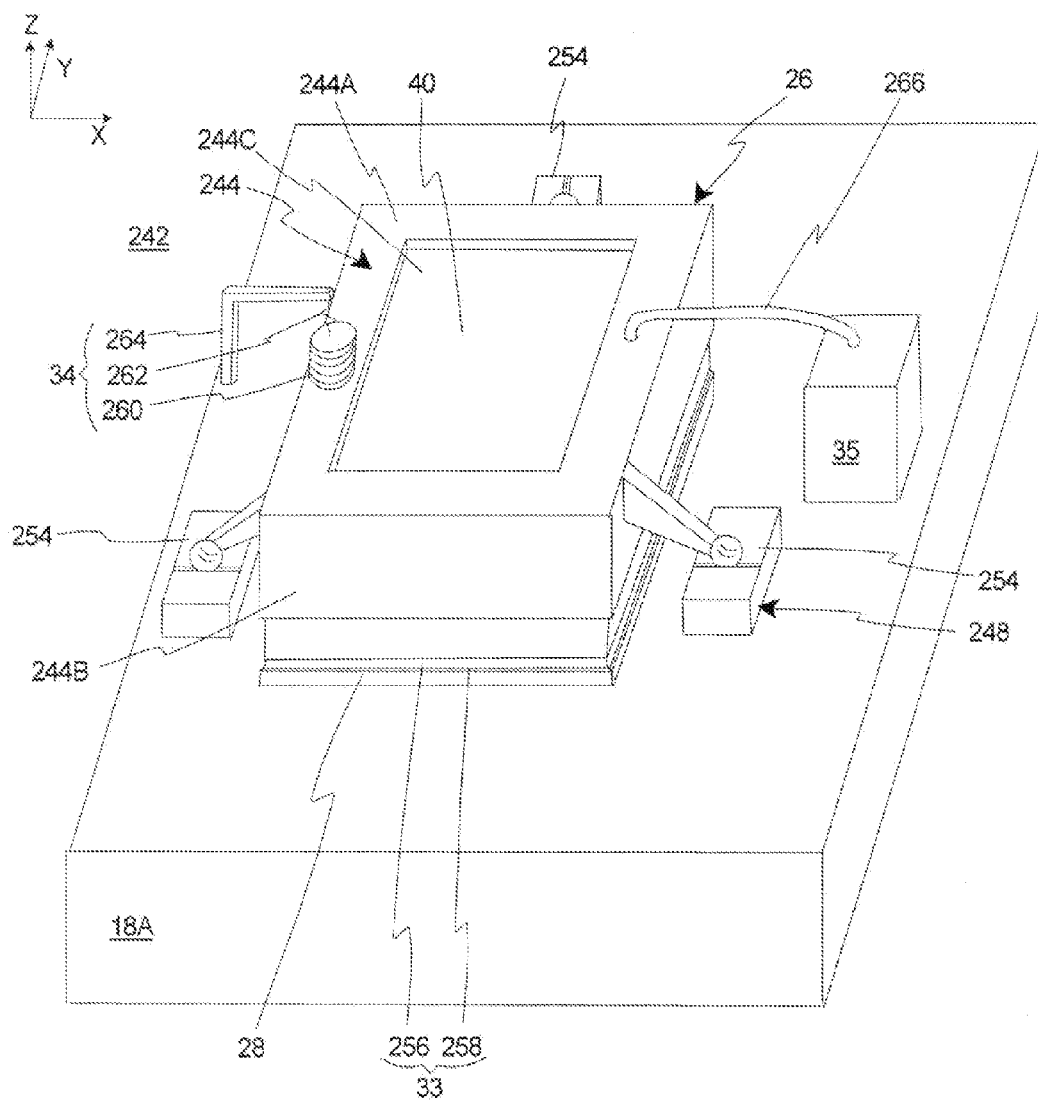
FIG. 2 is a perspective view of a portion of a stage assembly, a workpiece, and a first embodiment of a chamber assembly having features of the present invention.

FIG. 2 is a perspective view of the first stage 18A, the workpiece 28, and a first embodiment of a chamber assembly 26 having features of the present invention. In this embodiment, the first stage 18A supports both the workpiece 28 and the chamber assembly 26. Further, in this embodiment, the first stage 18A and the workpiece 28 are each generally rectangular in shape. Moreover, in this embodiment the first stage 18A includes a rectangular shaped aperture (not shown) that allows energy that passes through the workpiece 28 to pass through the first stage 18A. Alternatively, the first stage 18A and the workpiece 28 can have another shape or configuration.

In certain embodiments, the first stage 18A, the workpiece 28, and the chamber assembly 26 are substantially surrounded by an environment 242 having an environmental pressure. For example, in some embodiments, the environmental pressure is approximately equal to the atmospheric pressure.

For example, the work piece 28 can be an LCD mask that is very large and very thin. As a non-exclusive example, the LCD mask 28 is approximately 1.6 m×1.5 m×17 mm. As a result, this type of mask 28 can sag enough under its own weight to cause focus problems. As provided herein, it is desirable to keep the mask 28 flat. In certain embodiments, this requires maintaining an approximately 367 Pascal vacuum in the sealed chamber 40 relative to environment 242. The chamber assembly 26 provided herein is suitable for accurately generating and maintaining the desired vacuum.

The design of the chamber assembly 26 can be varied depending on the specific requirements of the exposure apparatus 10 (illustrated in FIG. 1) and the workpiece 28. In FIG. 2, the chamber assembly 26 includes a chamber housing 244, a chamber support assembly 248, the seal assembly 33, one or more transducer assemblies 34 (only one is illustrated in FIG. 2), and the pressure source 35. Alternatively, for example, the chamber assembly 26 can be designed without the chamber support assembly 248 or the transduce assembly 34.

The chamber housing 244 cooperates with the mask 28 and the seal assembly 33 to define the sealed chamber 40 adjacent to the mask 28. In FIG. 2, the chamber housing 244 is shaped somewhat similar to an open box that is inverted. In this embodiment, the chamber housing 244 includes a generally planar section 244A that is substantially parallel to the workpiece 28, and a flange section 244B that is positioned near the outer perimeter of the planar section 244A and that cantilevers downward away from the planar section 244A toward the workpiece 28. In this embodiment, the planar section 244A can include a transparent region 244C that allows for the transmission of energy (e.g light) through the chamber housing 244 to the workpiece 28. Alternatively, the entire chamber housing 244 can be made to be transparent to the energy that is directed at the workpiece 28.

The chamber support assembly 248 provides support for the chamber housing 244 relative to the mask 28 and/or relative to the stage 18A. With this design, the chamber support assembly 248 reduces or inhibits the chamber housing 244 applying weight to the mask 28 and from deforming the mask 28. The design of the chamber support assembly 248 can be varied to suit the specific requirements of the chamber assembly 26 and/or the specific requirements of the exposure apparatus 10. Alternatively, as noted above, the chamber assembly 26 can be designed without the chamber support assembly 248.

In certain embodiments, the chamber support assembly 248 includes a plurality of spaced apart chamber supports 254 that cooperate to support the chamber housing 244 relative to the mask 28, and/or to inhibit movement of the chamber housing 244 relative to the mask 28. In the embodiment illustrated in FIG. 2, the chamber support assembly 248 includes three chamber supports 254 that are substantially equally spaced apart from each other around the perimeter of the chamber housing 244. In this embodiment, the chamber support assembly 248 supports the chamber housing 244 in a substantially kinematic fashion above the stage 18A. In alternative embodiments, the chamber support assembly 248 can be designed with more than three or less than three chamber supports 254. Still alternatively, the chamber supports 254 can be positioned in different locations around the perimeter of the chamber housing 244.

A more detailed description of one embodiment of a suitable chamber support assembly 248 is provided in U.S. patent application Ser. No. 12/721,493, filed on Mar. 10, 2010, and entitled "INTERMEDIATE VACUUM SEAL ASSEMBLY FOR SEALING A CHAMBER HOUSING TO A WORKPIECE". As far as permitted, the contents of application of U.S. patent application Ser. No. 12/721,493 are incorporated herein by reference.

The seal assembly 33 seals a chamber gap between the chamber housing 244 and the mask 28. The design of the seal assembly 33 can be varied to suit the specific requirements of the chamber assembly 26, the workpiece 28, and/or the specific requirements of the exposure apparatus 10. In one embodiment, the seal assembly 33 includes a flexible barrier 256 that is secured to the chamber housing 244, and a compliant seal 258 that is secured to the flexible barrier 256. In this embodiment, the flexible barrier 256 expands or contracts to adjust for changes in size of the chamber gap, and the compliant seal 258 engages the workpiece 28 to seal non-uniformities in the workpiece 28.

In one embodiment, the flexible barrier 256 (i) is relatively stiff along the first axis, along the second axis, and about the third axis, and (ii) is flexible along the third axis, about the first axis, and about the second, axis. For example, the flexible barrier 256 is relatively stiff horizontally (e.g. along the X axis, along the Y axis, and about the Z axis (theta Z)), and the flexible barrier 256 is flexible vertically (e.g. along the Z axis, about the X axis (theta X), and about the Y axis (theta Y)). Further, the seal 258 is a soft foam seal. With this design, the seal assembly 33 does not transfer any loads between the chamber housing 244 and the workpiece 28.

In FIG. 2, the flexible barrier 256 and the seal 258 are each generally rectangular frame shaped to seal the chamber gap between the chamber housing 244 and the workpiece 28. Alternatively, the seal assembly 33 can have another shape to suit the shape of the chamber gap.

The one or more transducer assemblies 34 quickly respond to leaks or injections of fluid in chamber assembly 26 to maintain a constant and stable chamber pressure in the chamber assembly 26. The number and design of the transducer assemblies 34 can be varied. In FIG. 2, the chamber assembly 26 includes a single transducer assembly 34. Alternatively, the chamber assembly 26 can be designed to include two, three, four, five, or more than five transducer assemblies 34.

In one non-exclusive embodiment, each transducer assembly 34 can be a fluid-to-mechanical transducer which expands or contracts as needed to compensate for pressure variations due to leaks or injection to the sealed chamber 40, thereby stabilizing the pressure in the sealed chamber 40. For example, each transducer assembly 34 can include a variable chamber 260, a chamber adjuster 262, and an adjuster support 264. In this embodiment, (i) the adjuster support 264 is an inverted "L" shaped beam that is secured to the first stage 18A; (ii) the chamber adjuster 262 is a resilient spring that extends between the adjuster support 264 and the variable chamber 260; and (iii) the variable chamber 260 is a fluid type bellows. With this design, the variable chamber 260 expands or contracts as needed to compensate for pressure variations in the sealed chamber 40.

The pressure source 35 accurately maintains the pressure within the chamber assembly 26 to accurately maintain the shape of the workpiece 28. Stated in another fashion, the pressure source 35 is in fluid communication with and controls a chamber pressure within the sealed chamber 40. The design of the pressure source 35 can be varied pursuant to the teachings provided herein. In certain embodiments, the pressure source 35 directs a relatively large enough amount of fluid through a relatively large passageway to control the pressure adjacent to the workpiece 28.

In one embodiment, the pressure source 35 can be a connector conduit assembly 266 (e.g., one or more hoses) to provide fluid to and/or remove fluid from the sealed chamber 40 in order to control the chamber pressure within the sealed chamber 40. In certain embodiments, the pressure source 35 controls the chamber pressure to be different than the environmental pressure so as to reduce and minimize any sagging of the mask 28 due to the forces of gravity. More particularly, in certain embodiments where the mask 28 is positioned substantially beneath the chamber housing 244, the pressure source 35 controls the chamber pressure to be less than the environmental pressure. In one non-exclusive embodiment, the pressure source 35 can control the chamber pressure so that the chamber pressure is at a slight vacuum (e.g. less than the environmental pressure by between approximately 200 and 600 Pascals). For example, the pressure source 35 can control the chamber pressure so that the chamber pressure is less than the environmental pressure by between approximately 350 and 400 Pascals. With this design, because the environmental pressure below the mask 28 is greater than the chamber pressure above the mask 28, the influence of gravity on the mask 28 can be compensated for.

Alternatively, in certain embodiments where the mask 28 is positioned substantially above the chamber housing 244, and the pressure source 35 can control the chamber pressure to be greater than the environmental pressure so as to minimize any sagging of the mask 28 due to the forces of gravity.

Figure 3A:
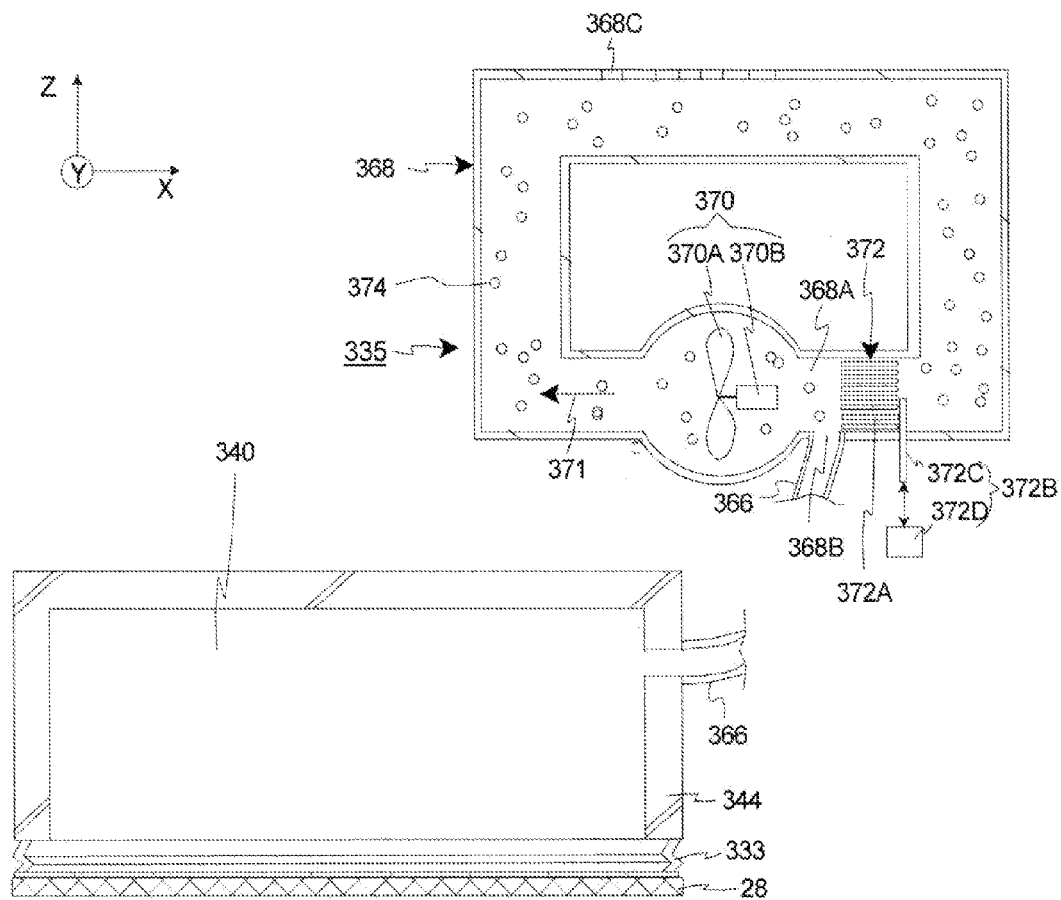
FIG. 3A is a simplified cross-sectional view of the workpiece, a chamber housing, a seal assembly, and a pressure source having features of the present invention.

FIG. 3A is a simplified cross-sectional view of the workpiece 28, a simplified, cross-sectional illustration of the chamber housing 344, a simplified, cross-sectional illustration of the seal assembly 333, and a simplified, cross-sectional illustration of one embodiment of a pressure source 335 having features of the present invention. In certain embodiments, the pressure source 335 is uniquely designed to achieve a very weak vacuum within less than a one percent tolerance of the target. With the designs provided herein, the vacuum generated is very stable even when the pressure source 335 is passive. As alternative, non-exclusive examples, with active control, the designs provided herein can achieve control within approximately ±0.6, ±0.5, ±0.4, ±0.3, or ±0.2 Pascal.

In FIG. 3A, the pressure source 335 includes a fluid passageway 368, a fluid mover 370, and a flow restrictor 372. In this embodiment, the fluid mover 370 directs a relatively large enough amount of fluid 374 (illustrated as small circles) through a relatively large fluid passageway 368 past the flow restrictor 372 to control the pressure in the chamber housing 344 adjacent to the workpiece 28.

The fluid passageway 368 provides a path for the fluid 374 to be pulled past the flow restrictor 372 by the fluid mover 370. The size and shape of the fluid passageway 368 can be varied pursuant to the teachings provided herein. In alternative non-exclusive embodiments, the fluid passageway 368 is relatively large and defines an opening 368A having a cross-sectional area of at least approximately 25 cm$^2$, 100 cm$^2$, 225 cm$^2$, 500 cm$^2$, 1452 cm$^2$, or 3000 cm$^2$ near the flow restrictor 372 and the fluid mover 370. However, the size of the opening 368A can be varied to match the design of the fluid mover 370 and the flow restrictor 372. Further, in FIG. 3A, the fluid passageway 368 is generally rectangular tube shaped. Alternatively, the fluid passageway 368 can be a tube with another shape.

In the embodiment illustrated in FIG. 3A, the fluid passageway 368 includes a conduit inlet 368B that is positioned between the flow restrictor 372 and the inlet to the fluid mover 370. In this embodiment, the conduit inlet 368B is in fluid communication with the sealed chamber 340 via the connector conduit assembly 366. With this design, the pressure drop created by pulling the fluid 374 past the flow restrictor 372 creates an accurately controllable vacuum in the conduit inlet 368B and the sealed chamber 340.

In FIG. 3A, the fluid passageway 368 is a mostly contained system in which flow from the outlet of the fluid mover 370 is directed back to an inlet of the flow restrictor 372. This design of the fluid passageway 368 is particularly suited for applications in which the pressure source 335 is placed in the vicinity of interferometers of the measurement system 22 (illustrated in FIG. 1). In this embodiment, the fluid passageway 368 is a tunnel that guides and circulates the fluid 374 coming out of the fluid mover 370 back into the intake of the flow restrictor 372. In one embodiment, the fluid passageway 368 can include one or more relatively small equalization apertures 368C that extend through the wall of the fluid passageway 368 to allow the pressure in the fluid passageway 368 to always equalize to the ambient pressure. The flow through these equalization apertures 368C should not be bigger than the disturbance flow of the system and should generally be very small.

Alternatively, the fluid passageway 368 can be a conduit that is open on each end.

The fluid mover 370 moves the fluid 374 in the fluid passageway 368 past the flow restrictor 372. In FIG. 3A, the flow direction of the fluid 374 is indicated by arrow 371. In one non-exclusive embodiment, the fluid mover 370 is a fan that includes a fan blade assembly 370A, and a source motor 370B that rotates the fan blade assembly 370A to pull the fluid 374 past the flow restrictor 372. In alternative, non-exclusive embodiments, the fluid mover 370 generates flow of the fluid 374 in the fluid passageway 368 of at least approximately 0.3, 0.8, 1.766, 3.5, or 10 cubic feet per minute.

As provided herein, the rotation rate (speed control) of the source motor 370B can be selectively controlled to control the flow of the fluid 374 in the fluid passageway 368 past the flow restrictor 372 and the chamber pressure in the sealed chamber 340. For example, the rotation rate can be increased to increase the vacuum or decreased to decrease the vacuum.

In an alternative embodiment, the fluid mover 370 is a positive displacement pump so that the controlled fluid flow remains constant regardless of the pressure drop caused by the flow restrictor 372. Still alternatively, the fluid mover 370 can be a screw type pump.

Further, in certain embodiments, depending on the heat generated in the source motor 370B, some cooling may be required to inhibit the temperature of the recirculating fluid 374 from rising. For example, cooling could be applied to the source motor 370B itself, to the flow restrictor 372, to the walls of the fluid passageway 368, or to some other convective cooling features inside the flow path.

The flow restrictor 372 restricts the flow of the fluid 374 in the fluid passageway 368. There are many options for the flow restrictor 372. In one embodiment, the flow restrictor 372 includes a static restrictor 372A and a variable restrictor 372B. As a non-exclusive example, the static restrictor 372A can be a honeycomb type filter (e.g. a honeycomb material with many small parallel thru channels) that is placed in the fluid passageway 368. A honeycomb type filter has large perimeter to cross-section area for the flow and provides somewhat laminar flow. Alternatively, the static restrictor 372A can be another porous media such as cloth or mesh or open-cell foam. Still alternatively, the flow resistor 372 can be designed without the static restrictor 372A.

The variable restrictor 372B can be selectively controlled to precisely control the chamber pressure in the sealed chamber 340. In one embodiment, the variable restrictor 372B is a flow orifice or channel with a controllable/adjustable channel height and/or width. This type of design provides a relatively large range of resistance. For example, in FIG. 3A, the variable restrictor 372B can include a flow blocker 372C and a blocker mover 372D that selectively moves the flow blocker 372C relative to the fluid passageway 368. In FIG. 3, the flow blocker 372C is a flat plate, and the blocker mover 372D is a linear motor that selectively moves the flow blocker 372C up or down in the fluid passageway 368 to control the amount of restriction in the fluid passageway 368 and control the chamber pressure. In this embodiment, moving the flow blocker 372C changes the open cross-section that the fluid 374 flow can go through and changes the resistance.

As provided herein, the fluid 374 flow through the flow restrictor 372 creates a pressure drop. With the present design, if the flow rate and the flow resistance remain constant, the pressure drop will remain constant and very stable. Further, the flow rate (via control of the flow mover 370) and/or the flow resistance (via the flow restrictor 372) can be selectively adjusted to adjust the pressure drop and ultimately the chamber pressure. Further, in certain embodiments, the flow mover 370 and the flow resistance can be independently controlled.

Figure 3B:
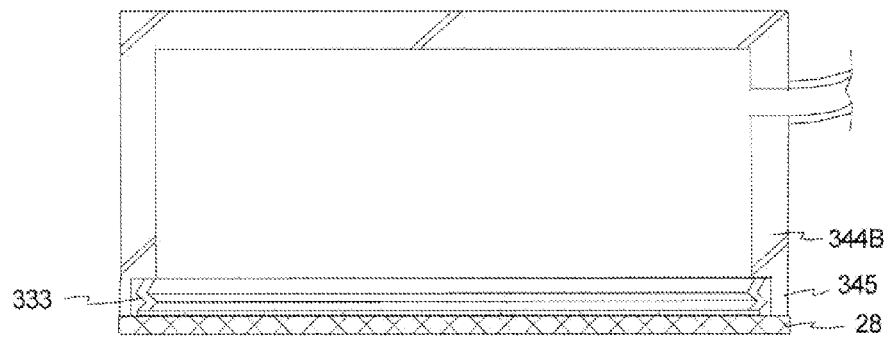
FIG. 3B is a simplified cross-sectional view of the workpiece, another embodiment of the chamber housing, and the seal assembly having features of the present invention.

FIG. 3B is a simplified cross-sectional view of the workpiece 28, a simplified, cross-sectional illustration of another embodiment of the chamber housing 344B, and a simplified, cross-sectional illustration of the seal assembly 333. In this embodiment, the chamber housing 344B includes an extended lip 345 that engages the workpiece 28. With this design, the weight of the chamber housing 344B is exerted on the workpiece 28.

Figure 4:
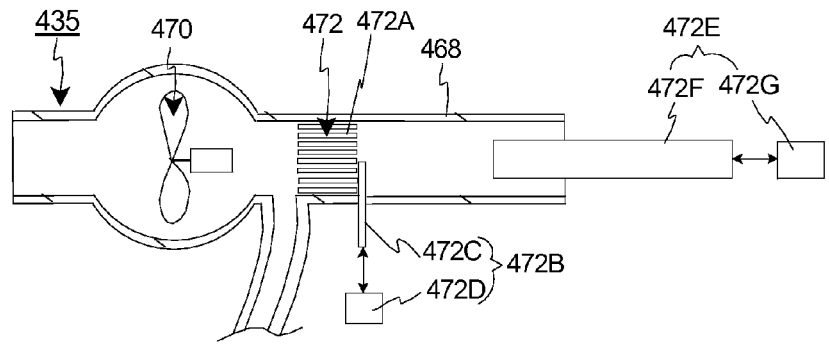
FIG. 4 is a simplified cross-sectional view of another embodiment of the pressure source.

FIG. 4 is a simplified cross-sectional view of another embodiment of the pressure source 435. In this embodiment, the fluid passageway 468 is open at both ends, and the fluid mover 470 is similar to the fluid mover 370 described above and illustrated in FIG. 3. Further, in this embodiment, the flow restrictor 472 includes (i) a fixed restrictor 472A that is similar to the fixed restrictor 372A described above; (ii) a first variable restrictor 472B that includes a first flow blocker 472C that is similar to the flow blocker 372C described above, and a first blocker mover 472D that is similar to the blocker mover 372D described above; and (iii) a second variable restrictor 472E that includes a second flow blocker 472F, and a second blocker mover 472G. In this embodiment, the second flow blocker 472F is positioned at the inlet to the fluid passageway 468 and is selectively moved by the second blocker mover 472G to selectively adjust the channel length of the fluid passageway 468. With this design, the resistance of the fluid passageway 468 can be changed by changing the channel height and by changing the channel length. Alternatively, this system can be designed without one of the variable restrictors 472B, 472E.

Figure 5:
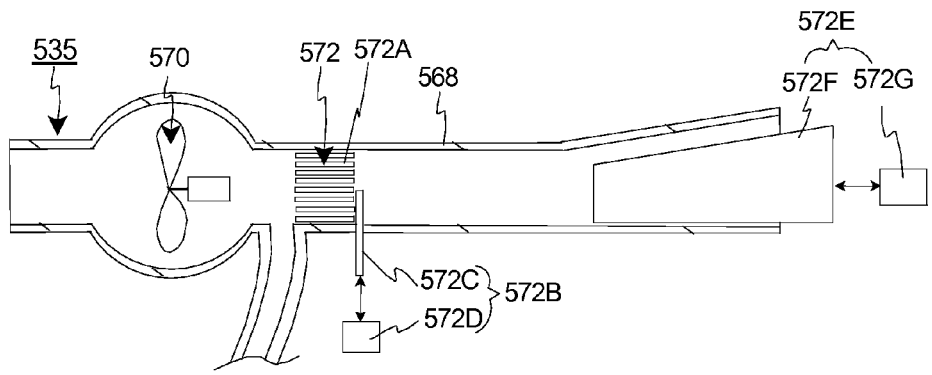
FIG. 5 is a simplified cross-sectional view of still another embodiment of the pressure source.

FIG. 5 is a simplified cross-sectional view of still another embodiment of the pressure source 535. In this embodiment, the fluid passageway 568 is open at both ends, and the fluid mover 570 is similar to the fluid mover 370 described above and illustrated in FIG. 3. Further, in this embodiment, the flow restrictor 572 includes (i) a fixed restrictor 572A that is similar to the fixed restrictor 372A described above; (ii) a first variable restrictor 572B that includes a first flow blocker 572C that is similar to the flow blocker 372C described above, and a first blocker mover 572D that is similar to the blocker mover 372D described above; and (iii) a second variable restrictor 572E that includes a second flow blocker 572F, and a second blocker mover 572G. In this embodiment, the second flow blocker 572F is positioned at the inlet to the fluid passageway 568, is wedge shaped and is selectively moved by the second blocker mover 572G to selectively and simultaneously adjust the channel length and channel size of the fluid passageway 568. With this design, the resistance of the fluid passageway 568 can be changed by changing the channel size and by changing the channel length. Alternatively, this system can be designed without one of the variable restrictors 572B, 572E.

Figure 6:
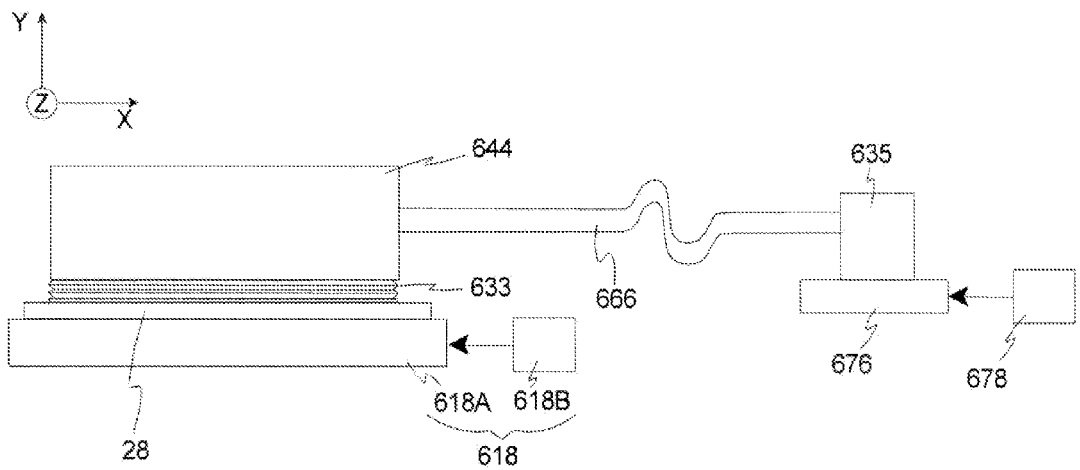
FIG. 6 is a simplified view of the workpiece, the stage assembly, the chamber housing, the seal assembly, and another embodiment of a pressure source having features of the present invention.

FIG. 6 is a simplified view of the workpiece 28, the workpiece stage assembly 618, the chamber housing 644, the seal assembly 633, and the pressure source 635. In this embodiment, the workpiece stage assembly 618 includes the workpiece stage 618A that retains the workpiece 28, and a workpiece mover assembly 618B that selectively moves the workpiece 28. Further, the connector conduit assembly 666 is a single tube that connects the pressure source 635 in fluid communication to the chamber housing 644.

In one embodiment, the connector conduit 666 is relatively short, e.g. less than approximately two meters. In certain embodiments, in order to inhibit vibration from the pressure source 635 from disturbing the workpiece 28 and the workpiece stage 618A, the system can include a source stage 676 that retains the pressure source 635, and a source stage mover 678 that moves the source stage 676 and the pressure source 635. For example, the source stage mover 678 can be controlled to move the source stage 676 so that the source stage 676 substantially follows the movement of the workpiece stage 618A. This design can reduce disturbances to the workpiece stage 618A resulting from, for example, the tension in the connector conduit assembly 666 or bending stiffness of the connector conduit assembly 666. For example, when the pressure source 635 is moved to follow the workpiece 28, the amount of tension in the connector conduit assembly 666 and the configuration of the connector conduit assembly 666 does not change as a function of the motion of the workpiece stage 618A and it does not become disturbed by the connection of the connector conduit assembly 666. Further, in certain embodiments, the source stage 676 can be moved in conjunction with the workpiece stage 618A, at least, during critical moments, such as during exposure.

Alternatively, in order to prevent vibration from the pressure source 635 from disturbing the workpiece 28 and workpiece stage 618A, the pressure source 635 can be placed on a platform that is as far away as is practically possible (typically approximately two meters) from the workpiece 28, and the connector conduit assembly 666 can be long enough to communicate the vacuum to the moving chamber housing 644.

Figure 7:
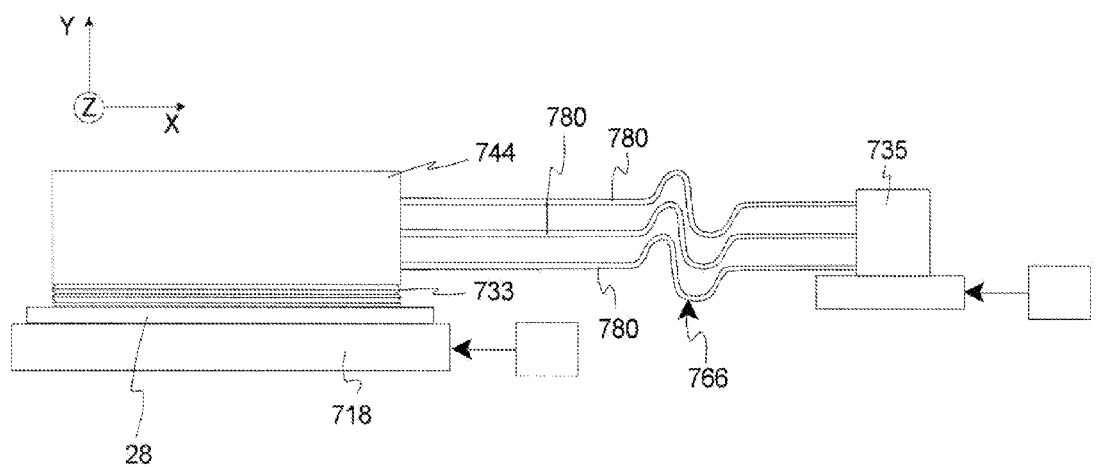
FIG. 7 is a simplified view of the workpiece, the stage assembly, the chamber housing, the seal assembly, and yet another embodiment of a pressure source having features of the present invention.

FIG. 7 is a simplified view of the workpiece 28, the workpiece stage assembly 718, the chamber housing 744, the seal assembly 733, and the pressure source 735. In this embodiment, these components are similar to the corresponding components described above and illustrated in FIG. 6. However, in this embodiment, the connector conduit assembly 766 is different.

More specifically, as provided herein, the inertia of the air inside the connector conduit assembly 766 interacts with the capacitance of the air inside the chamber housing 744 similar to a mass and spring system and forms a Helmholtz oscillator. The oscillations from this oscillator can make it difficult to maintain the vacuum inside the chamber housing 744 within the desired limits. In certain embodiments, the radius of the connector conduit assembly 766 can be reduced to better damp these oscillations. However, decreasing the radius of the connector conduit assembly 766 to increase the resistance has two undesired effects. First, it increases the inertia of the connector conduit assembly 766. Second, it also increases the pressure drop across the connector conduit assembly 766 due to flow of air across the connector conduit assembly 766. There can be flow across the connector conduit assembly 766 if there are any air leaks into the chamber housing 744. This increase in the pressure drop across the connector conduit assembly 766 means the pressure source 735 has to be at a stronger vacuum than negative 367 Pascal to maintain a negative 367 Pascal at the workpiece 28.

In order to reduce the burden on the pressure source 735 and have an adequate vacuum range, the present invention dampens the oscillation without substantially increasing resistance of the connector conduit assembly 766.

In one embodiment, the present invention utilizes multiple connector tubes 780 in parallel to reduce the inertia of the connector conduit assembly 766 because of the increased cross-section area. In this embodiment, each connector tube 780 independently connects the pressure source 735 to the chamber housing 744 in fluid communication. It should be noted that any of these connector tubes 780 can be referred to as a first, second, third, or fourth connector tube 780. If a sufficient number of connector tubes 780 are used in parallel, and each connector tube 780 is small enough, a properly damped system can be achieved that can still handle the desired/expected leaks in the chamber housing 744 with minimal pressure drop across the connector conduit assembly 766.

The number of connector tubes 780 and the inner diameter of each connector tube 780 can be varied to achieve the desired system performance. In one non-exclusive embodiment, approximately three connector tubes 780 can be utilized, and each connector tube 780 can have an inner diameter of approximately one inch. Alternatively, the connector conduit assembly 766 can include more than three or fewer than three connector tubes 780 and each connector tube can have an inner diameter of greater than or less than approximately one half inch.

Figure 8A:
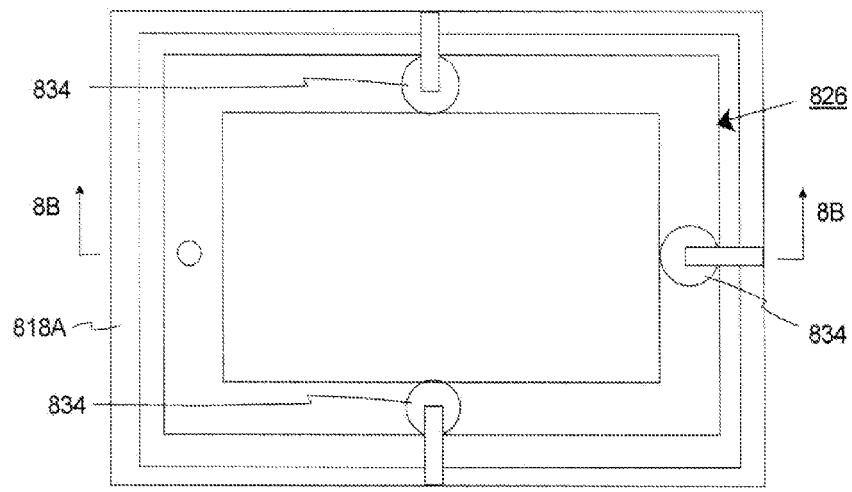
FIG. 8A is a simplified top view of a workpiece stage, and a chamber assembly having features of the present invention.

FIG. 8A is a simplified top view of a workpiece stage 818A, and a chamber assembly 826 having features of the present invention. In this embodiment, the chamber assembly 826 includes three spaced apart transducer assemblies 834. Alternatively, the chamber assembly 826 can be designed to include more than three or fewer than three spaced apart transducer assemblies 834.

Figure 8B:
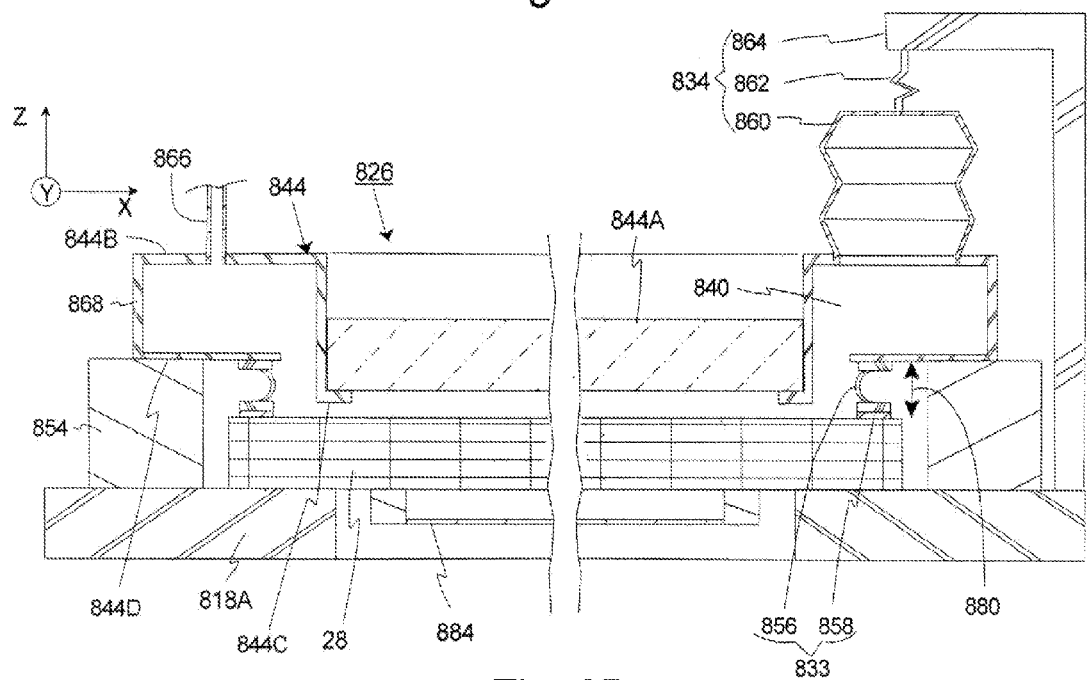
FIG. 8B is a cross-sectional view taken on line 8B-8B in FIG. 8A.

FIG. 8B is a cross-sectional view taken on line 8B-8B in FIG. 8A. FIG. 8B illustrates the workpiece stage 818A, the workpiece 28 (e.g. a mask), and the chamber assembly 826. A portion of the connector conduit assembly 866 is also shown.

Additionally, FIG. 8B illustrates a cross-sectional view of one of the transducer assemblies 834. As provided herein, each transducer assembly 834 can be actively controlled or passively controlled. In FIG. 8B, the transducer assembly 834 is passively controlled. In this embodiment, the transducer assembly 834 is a fluid-to-mechanical transducer which expands or contracts as needed to compensate for pressure variations due to leaks or injections to the sealed chamber 840, thereby stabilizing the pressure in the sealed chamber 840. In this embodiment, the transducer assembly 834 includes a variable chamber 860, a chamber adjuster 862, and an adjuster support 864. In one embodiment, the variable chamber 860 is a hollow, cylindrical shaped, fluid type flexible bellows that includes an open bottom that is in fluid communication with the sealed chamber 840 and an enclosed top and sides. With this design, (i) as the variable chamber 860 expands, the effective volume of the sealed chamber 860 expands; and (ii) as the variable chamber 860 contracts, the effective volume of the sealed chamber 860 contracts. As a result thereof, the variable chamber 860 can be expanded or contracted as needed to compensate for pressure variations in the sealed chamber 840 to maintain a constant and stable vacuum in a sealed chamber 840.

Stated in another fashion, the dynamics of the anti-gravity system are dominated by the capacitance of the volume enclosed by the sealed chamber 840, and how this capacitance interacts with the inertia of the connector conduit assembly 866. For pressure stability and disturbance rejection, it is often desirable to increase the capacitance of this enclosed volume. As provided herein, the transducer assemblies 834 can be used to increase the capacitance of the enclosed volume.

In FIG. 8B, the adjuster support 864 is an inverted "L" shaped beam that is secured to the first stage 818A and that cantilevers upward away from the first stage 818A. Alternatively, the adjuster support 864 can have a configuration different than that illustrated in FIG. 8B. Moreover, in FIG. 8B, the chamber adjuster 862 is a resilient member (e.g. a spring) that extends between the adjuster support 864 and top of the variable chamber 860. With this design, the chamber adjuster 862 can be used to support the variable chamber 860 and counteract the pressure (e.g. the vacuum) in the variable chamber 860 to inhibit the chamber 860 from collapsing so that the variable chamber 860 can expand or contact as needed to maintain the desired chamber pressure.

As provided herein, the capacitance of the system increases as the compliance of the spring 862 and the bellows 860 increases. Accordingly, in certain embodiments, it is desired that the bellows 860 be very compliant so that the inherent stiffness of the bellows 860 does not limit how much the capacitance can be increased.

Figure 9A:
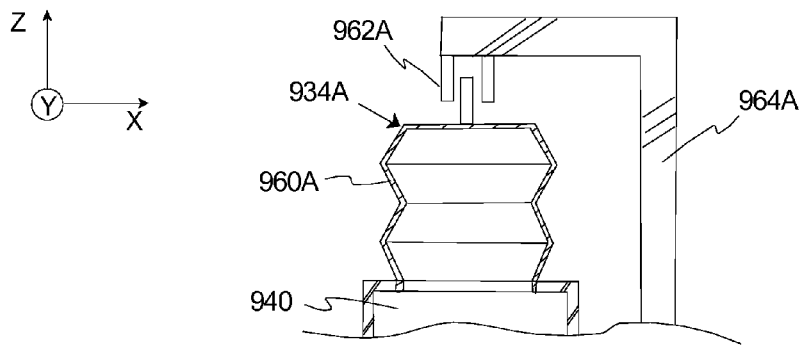
FIG. 9A is a simplified, cross-sectional view of a portion of a transducer assembly having features of the present invention.

FIG. 9A is a simplified, cross-sectional view of a portion of a transducer assembly 934A that can be used with the chamber assemblies disclosed herein. In this embodiment, the transducer assembly 934A includes a variable chamber 960A, and an adjuster support 964A that are similar to the corresponding components described above and illustrated in FIG. 8B. However, in this embodiment, the chamber adjuster 962A is different. More specifically, in this embodiment, the chamber adjuster 962A is a motor (e.g. a linear motor or voice coil motor) that can be actively controlled to expand or contract the variable chamber 960A as desired to selectively and quickly change the volume of the variable chamber 960A and thus change the volume of the sealed chamber 940. As a result thereof, the variable chamber 960A can be selectively expanded or contracted as needed to compensate for pressure variations in the sealed chamber 940.

As provided herein, in certain embodiments, the vacuum is generated with a pressure source (not shown in FIG. 9A) by pulling a known or controlled flow through a known or controlled resistance. Sometimes, in order get faster pressure response, the volume of the variable chamber 960A can be actively controlled with the motor 962A that moves the variable chamber 960A to quickly respond to sudden changes in pressure due to sudden disturbances.

Figure 9B:
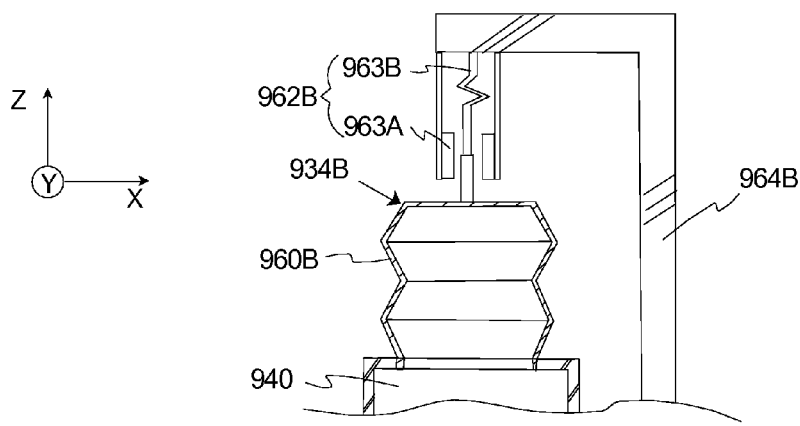
FIG. 9B is a simplified, cross-sectional view of a portion of another transducer assembly having features of the present invention.

FIG. 9B is a simplified, cross-sectional view of a portion of another transducer assembly 934B that can be used with the chamber assemblies disclosed herein. In this embodiment, the transducer assembly 934B includes a variable chamber 960B, and an adjuster support 964B that are similar to the corresponding components described above and illustrated in FIG. 8B. However, in this embodiment, the chamber adjuster 962B is different. More specifically, in this embodiment, the chamber adjuster 962B includes (i) a motor 963A (e.g. a linear motor or voice coil motor) that can be actively controlled to expand or contract the variable chamber 960B as desired to selectively and quickly change the volume of the variable chamber 960B, and (ii) a resilient member 963B (e.g. a spring) that can be used to support the variable chamber 960B, counteract the static pressure on the variable chamber 960B so that the motor 962C does not have to be controlled to perform these functions. This will reduce the heat generated by the motor 962C.

Figure 9C:
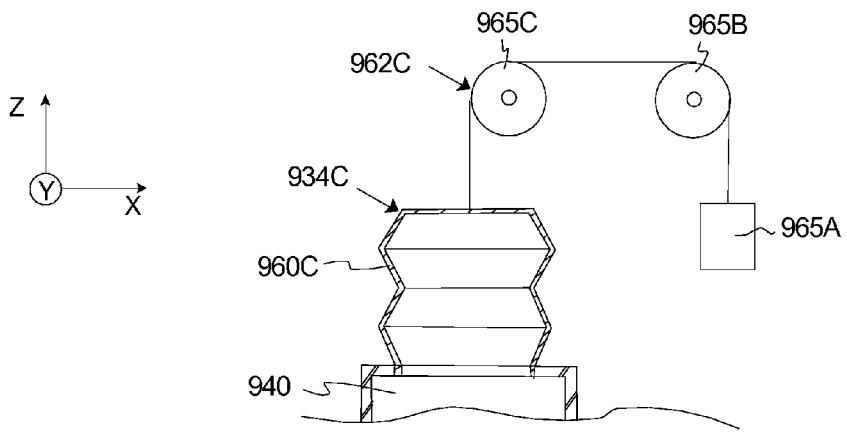
FIG. 9C is a simplified, cross-sectional view of a portion of still another transducer assembly having features of the present invention.

FIG. 9C is a simplified, cross-sectional view of a portion of still another transducer assembly 934C that can be used with the chamber assemblies disclosed herein. In this embodiment, the transducer assembly 934C includes a variable chamber 960C that is similar to the corresponding component described above and illustrated in FIG. 8B. However, in this embodiment, the chamber adjuster 962C is different. More specifically, in FIG. 9C, the chamber adjuster 962C includes a mass 965A, and a pair of pulleys 965B, 965C that can be used to support the variable chamber 960C and counteract the pressure (e.g. the vacuum) in the variable chamber 960C to inhibit the chamber 960C from collapsing so that the variable chamber 960C can expand or contact as needed to maintain the desired chamber pressure.

It should be noted that the chamber 960C can be inverted and the mass can merely be secured to the chamber 960C Referring back to FIG. 8B, the chamber housing 844 includes a transparent planar section 844A that is substantially parallel to the surface of the workpiece 28, and a flange section 844B that supports the planar section 844A relative to the workpiece stage 818A. In this embodiment, the flange section 844B is shaped somewhat similar to a rectangular tube that is constructed to have a generally open rectangular frame shape. In this embodiment, the flange section 844B includes (i) a support lip 844C that extends inward to support the planar section 844A, and (ii) a bottom surface 844D that engages a chamber support 854 that is positioned between the workpiece stage 818A and the flange section 844B. With this design, the weight of the chamber housing 844 is supported by the workpiece stage 818A via the chamber support 854. Further, with this design, the contact forces of the seal assembly 833 on the workpiece 28 are reduced (e.g. the preload force on the seal assembly 833 is minimized). Unfortunately, this reduces the amount by which the seal assembly 833 gets compressed.

Additionally, in this embodiment, a chamber gap 880 exists along the Z axis between the bottom surface 844D of the flange section 844 and the workpiece 818A. As provided herein, the size of the chamber gap 880 can vary according to the thickness of the workpiece 28. For example, if the workpiece 28 is a mask, they often get recycled and re-worked, whereby an existing pattern is machined off and a new pattern is laid. This process causes the thickness of the mask 28 to change and the chamber gap 880 to change.

The seal assembly 833 seals the chamber gap 880 between the chamber housing 844 and the workpiece 28. As provided herein, the seal assembly 833 is uniquely designed to accommodate changes in the thickness of the mask 28 and changes in the chamber gap 880 without causing changes to the preload force by the seal assembly 833.

In one embodiment, the seal assembly 833 includes a flexible barrier 856 that is secured to the chamber housing 844, and a compliant seal 858 that is secured to the flexible barrier 856. As provided herein, the soft foam seal 858 backed by the flexible barrier 856 allows the seal assembly 833 (i) to seal against rough and/or uneven surfaces with minimal preload force; and (ii) to seal a gap that may change in size and/or non-uniformly between the surfaces.

Figure 10:
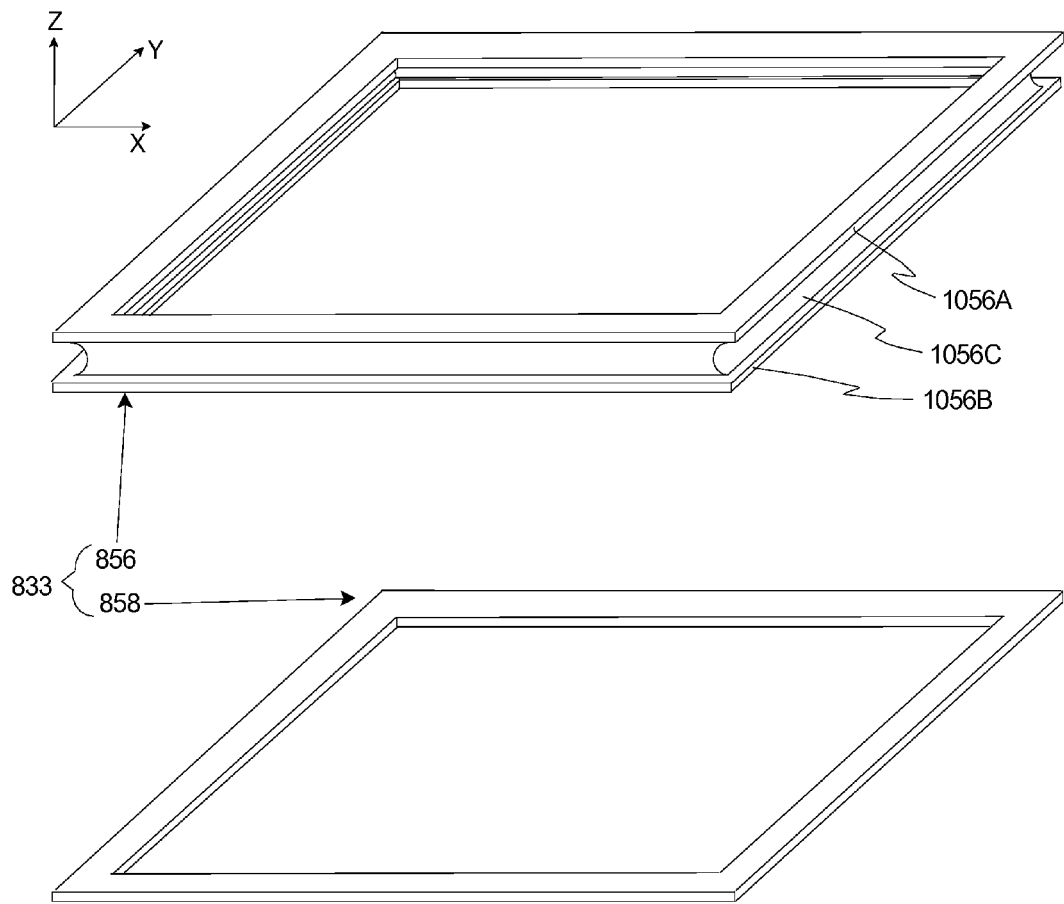
FIG. 10 is an exploded perspective view of a seal assembly having features of the present invention.

FIG. 10 is an exploded perspective view of one embodiment of the seal assembly 833, including the flexible barrier 856 and the compliant seal 858. In this embodiment, the flexible barrier 856 expands or contracts (along the Z axis, about the X axis, and about the Y axis) to adjust for changes in size of the chamber gap 882 (illustrated in FIG. 8B), and the compliant seal 858 engages the workpiece 28 (illustrated in FIG. 8B) to seal non-uniformities in the workpiece 28. For example, the flexible barrier 856 can be a seal drape that is vertically compliant and does not leak air. In one embodiment, the flexible barrier 256 (i) is relatively stiff horizontally along the X axis, along the Y axis, and about the Z axis (theta Z); and (ii) is flexible (compliant) vertically along the Z axis, about the X axis (theta X), and about the Y axis (theta Y). Further, the seal 858 is a soft foam seal.

In FIG. 10, the flexible barrier 856 and the seal 858 are each generally rectangular frame shaped to seal the chamber gap 882. Alternatively, the seal assembly 833 can have another shape to suit the shape of the chamber gap 882.

Moreover, in the non-exclusive embodiment illustrated in FIG. 10, the flexible barrier 856 includes (i) a flat, open rectangular shaped upper region 1056A that is secured to the bottom of the chamber housing 844; (ii) a flat open rectangular shaped lower region 1056B that is secured to the compliant seal 858; and (iii) an intermediate region 1056C that connects the upper region 1056A to the lower region 1056B and the flexes along the Z axis. Further, in this embodiment, the seal 858 is flat, open rectangular shaped. Alternatively, for example, the intermediate region 1056C can have a bellows type configuration and/or the seal 858 can be an "O" ring type seal.

Non-exclusive examples of suitable materials for (i) the flexible barrier 856 include latex, paper, EVAL EF-XL 12 um thick film, and thin metal foils, and (ii) the seal 858 include a urethane foam sold under the trademark Poron® by the Rogers Corporation, other urethane based foams, latex, and/or a fluoroelastomer sold under the trademark Viton® by DuPont.

Referring back to FIG. 8B, in one embodiment, the system includes a pellicle 884 that is secured to the underside of the workpiece 28 and that is positioned substantially beneath the workpiece 28. The pellicle 884 includes a very thin, clear surface that is spaced apart from the underside of the workpiece 28. The pellicle 884 is designed to protect or shield the pattern area of the workpiece 28 from unwanted particles that may impact the integrity of the pattern such that the unwanted particles will end up on the bottom surface of the pellicle 884 instead of on the pattern on the underside of the workpiece 28. Further, the thin, clear surface of the pellicle 884 is positioned spaced apart from the underside of the workpiece 28 a sufficient distance so that any unwanted particles that do adhere to the bottom surface of the pellicle 884 will be too out of focus to print when the illumination optical assembly 38 (illustrated in FIG. 1) guides the beam of light energy from the illumination source 36 (illustrated in FIG. 1) through the workpiece 28 and to the optical assembly 16 (illustrated in FIG. 1).

Figure 11A:
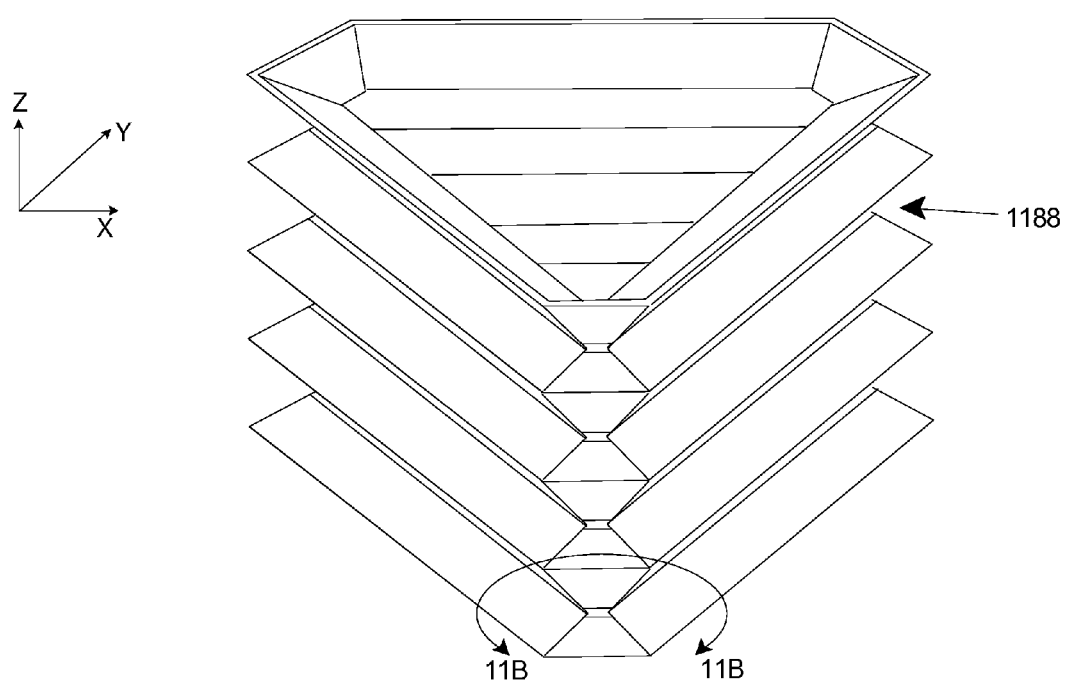
FIG. 11A is a simplified perspective view of one embodiment of a fluid bellows having features of the present invention.

FIG. 11A is a perspective view of a portion of one embodiment of a bellows 1188 having features of the present invention. As provided herein, the bellows 1188 has a unique fold design that significantly reduces the stiffness of the bellows 1188. As a result thereof, the fold design of the bellows 1188 is well suited for the variable chambers 260, 860 and/or the flexible barriers 256, 856 described herein. Further, the bellows 1188 can be used instead of pistons and cylinders in pressure control and flow control applications. Also, as non-exclusive examples, the bellows 1188 can be used to cover other components such as rails and actuators, or the bellows 1188 can be used as a tunnel between two enclosed chambers.

Figure 11B:
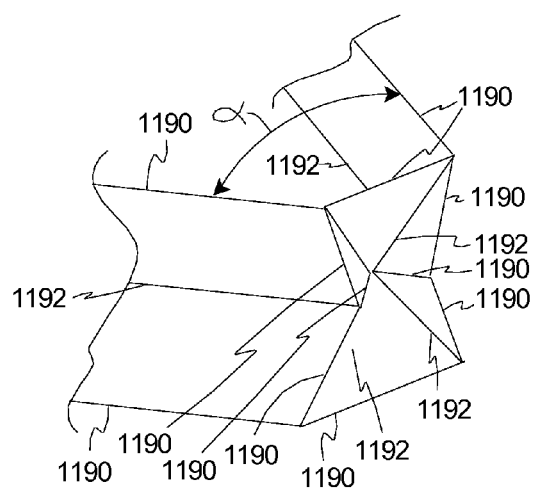
FIG. 11B is an enlarged, simplified perspective view of a portion of the fluid bellows of FIG. 11A.

In one embodiment, the bellows 1188 uses alternating concave and convex folds with components in both the vertical and tangential (circumferential) directions to cancel out the kinematic constraint of the folds and substantially reduce the stiffness of the bellows 1188. FIG. 11B is an enlarged view taken on line 11B-11B of FIG. 11A. In FIG. 11B, each reference number 1190 designates a convex fold, and each reference number 1192 designates a concave fold. In the bellow 1188 illustrated in FIGS. 11A and 11B, all the fold lines with vertical components alternate between convex and concave. In this case, they alternate every two fold-lines going tangentially around the circumference of the bellows.

In contrast, stiffness of conventional bellows is due in a small part to the stiffness of the fold-lines or pivot-edges, and in a larger part to how each face of the bellows is constrained to fold and unfold. Because of the conventional fold line design, the conventional bellows wants to open up tangentially as it is pulled apart axially. This will cause stiffness.

Referring to FIG. 11B, the angles of the fold lines of a basic unit corner have to be designed to achieve a desired corner angle α. For the bellows 11B illustrated in FIG. 11B, the corner was designed to have an angle α of approximately sixty degrees to form a triangular bellows 1188. For a square cross-section bellows 1188, the corner would be designed to have a corner angle α of approximately ninety degrees.

Figure 11C:
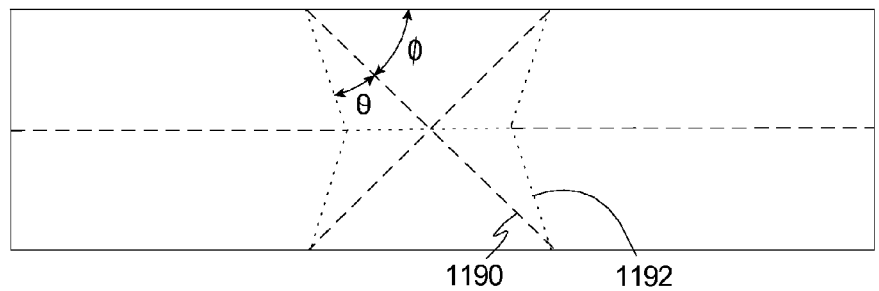
FIGS. 11C-11J illustrate portions of the bellows.

FIG. 11C illustrates the location of fold lines of an unfolded basic unit corner. In FIG. 11C, the long dashed lines indicate concave folds 1192, and the dotted lines indicate convex folds 1190. Angles φ and θ of the fold lines are illustrated in FIG. 11C. Typically angle φ=45° gives good results.

Figure 11D:
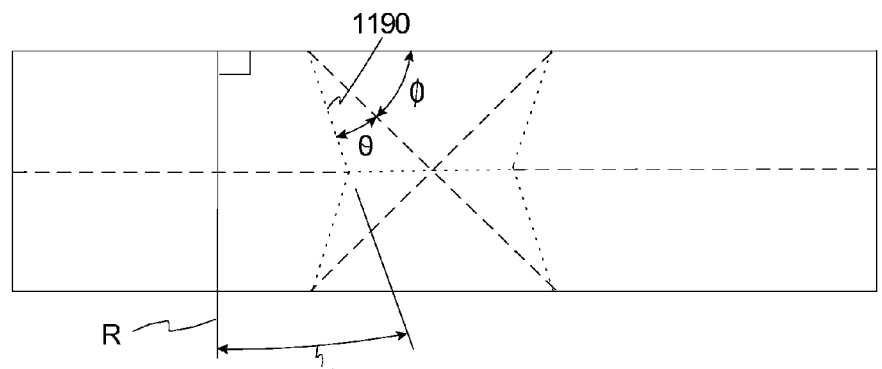

Referring to FIG. 11D, reference line R has been added as a marker, and it is not a fold line. In this illustration, reference line R is perpendicular to the straight horizontal lines, all of which remain horizontal as the piece is folded flat. In one design, the (90°-φ-θ) angle between the reference line R and the convex fold line 1190 will remain at (90°-φ-θ) as the piece is folded because both lines are on the same solid face.

Figure 11E:
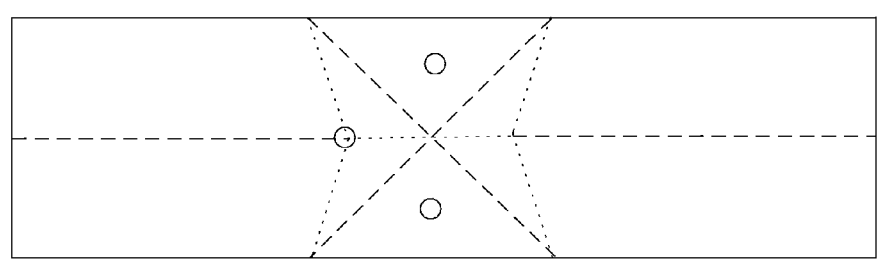

Referring to FIG. 11E, when the pieces are folded completely flat, the three points highlighted with circles will be touching.

Figure 11F:
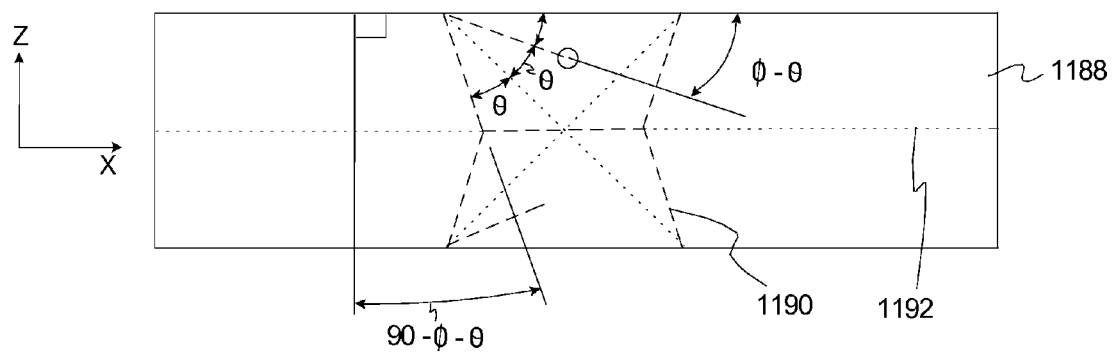

FIG. 11F illustrates the relationship between angles φ and θ for a portion of the bellows 1188.

Figure 11G:
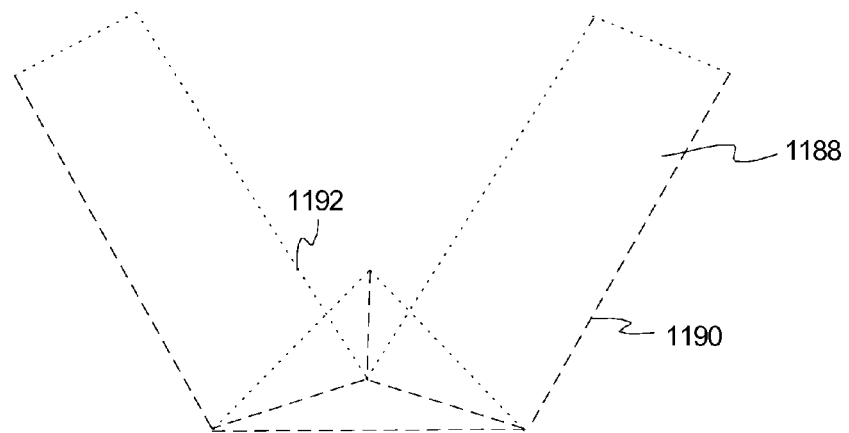

FIG. 11G illustrates the top, when this portion of the bellows 1188 is folded completely flat. FIGS. 11F and 11G also illustrates the concave folds 1192 (dotted lines) and the convex folds 1190 (long dashes).

Figure 11H:
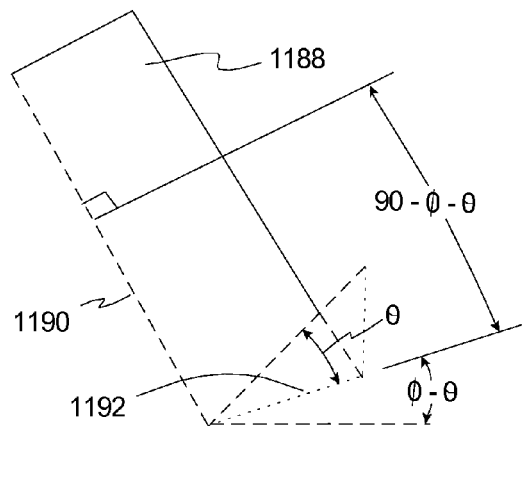
Figure 11I:
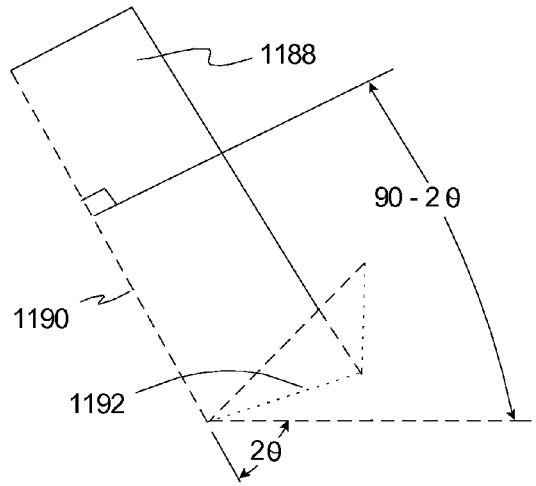
Figure 11J:
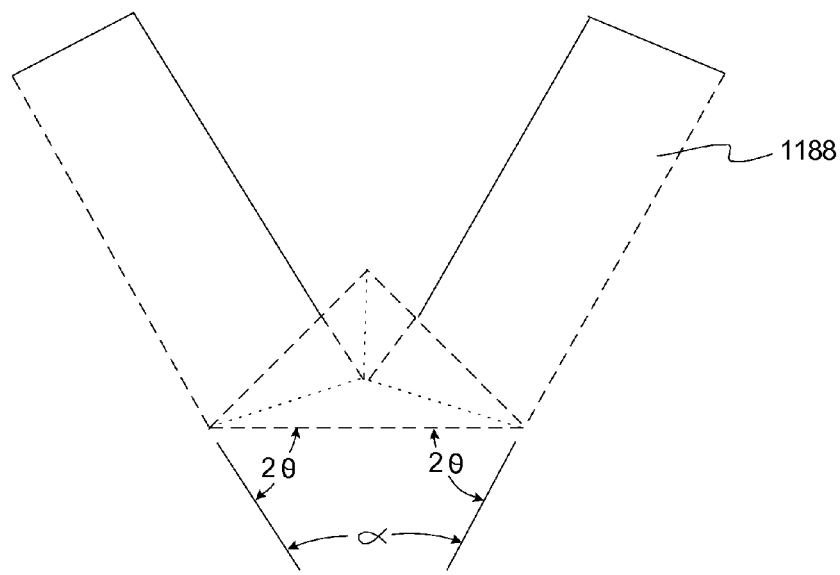

FIGS. 11H, 11I, and 11J illustrate the relationship between angles α, φ and θ of the folds. In FIG. 11J, a corner angle α is the desired angle of the bellows corner, can be calculated with the following formula:

$$\theta = \frac{180 - \alpha}{4}$$

For example, for a corner angle α=60° shown in these diagrams, then angle θ=30°, if φ=45°. Alternatively, for a corner angle α=90°, then θ=22.5°, φ=45°.

In one embodiment, the bellows 1188 are made out of a single folded sheet, such as a paper, or metal sheet, plastic, or another suitable material. However, it is also possible is to make the bellows out of a very thin flexible elastomeric membrane with thin laser-cut plates glued to the membrane for added rigidity. There are several options for doing this. As a first option, some plastic plates can be placed in front, and some plastic plates can be placed behind an elastomeric film/membrane. In this design, all gaps corresponding to concave folds must be widened from the center of the fold by twice the thickness of the plastic plates in order to avoid interference. However, if a piece on one side of a concave fold is behind the elastomeric membrane and the piece on the other side is in front of the membrane, then the gap corresponding to the fold can be widened by only the thickness and not twice the thickness.

As another option, all of the plastic plates can be positioned on the same side of the elastomeric membrane. With this design, all the pieces with concave corners must be spaced from the center of the fold line by twice the thickness in order to avoid interference.

In practice, some of the convex folds can interfere with each other when folded fully flat. To avoid this, a section can be added in between.

In addition, in practice when the bellows 1188 are axially compressed all the way and when the plates are folded fully flat the long plates that extend between the corners wedge inside the fold line between the two small triangular plates and all four plates wedge inside the fold line between the two big triangular plates. Thus even some of the convex folds may need to have an increased gap to allow room for the thickness of stacked plates inside the fold.

Figure 12:
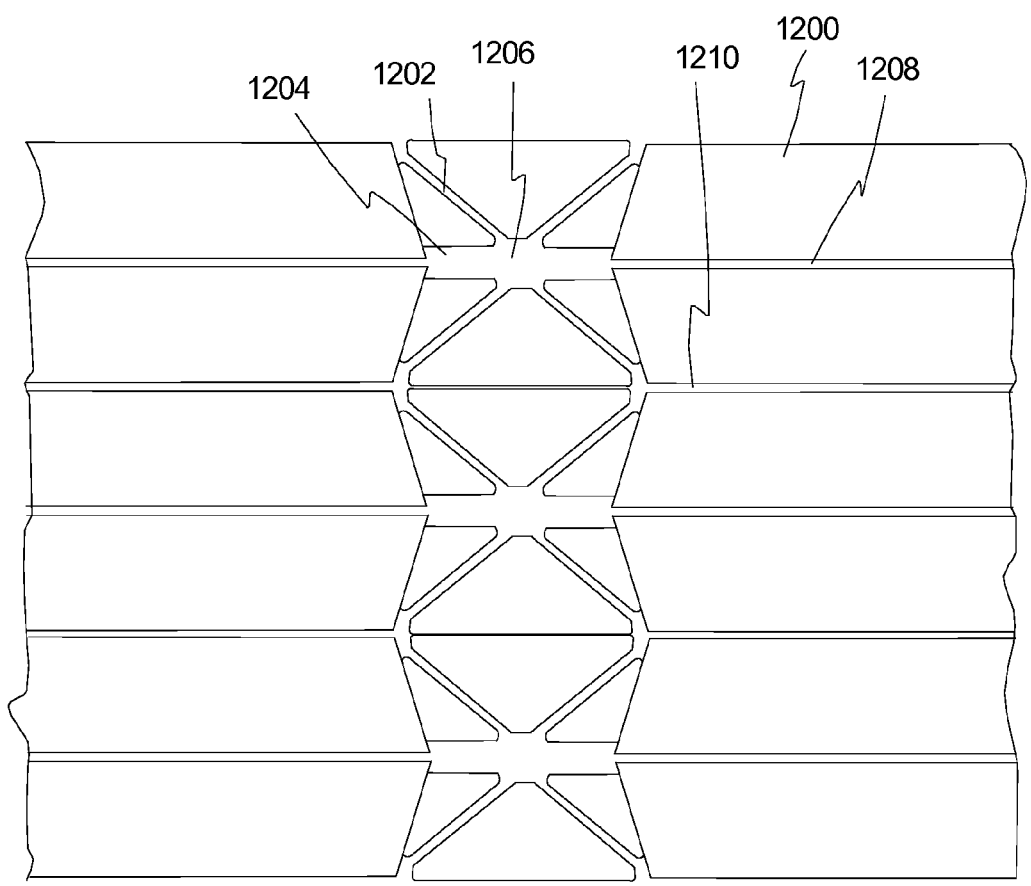
FIG. 12 is a simplified illustration of a portion of another embodiment of a fluid bellows.

FIG. 12 is a simplified illustration of a portion of another embodiment of a fluid bellows 1200 in a flat arrangement prior to being assembled. This embodiment has larger gaps and thus can be compressed more fully. In this non-exclusive example, t is the plate thickness and s is the combined thickness of the adhesive and the EVAL film. More specifically, in FIG. 12, (i) gap 1202 has a value of approximately 2 t, (ii) gap 1204 has a value of approximately 2 t+4 s, (iii) gap 1206 has a value of approximately 6 t+4 s, (iv) gap 1208 has a value of approximately 2 t, and (v) gap 1210 has a value of approximately 4 t+6 s.

Figure 13A:
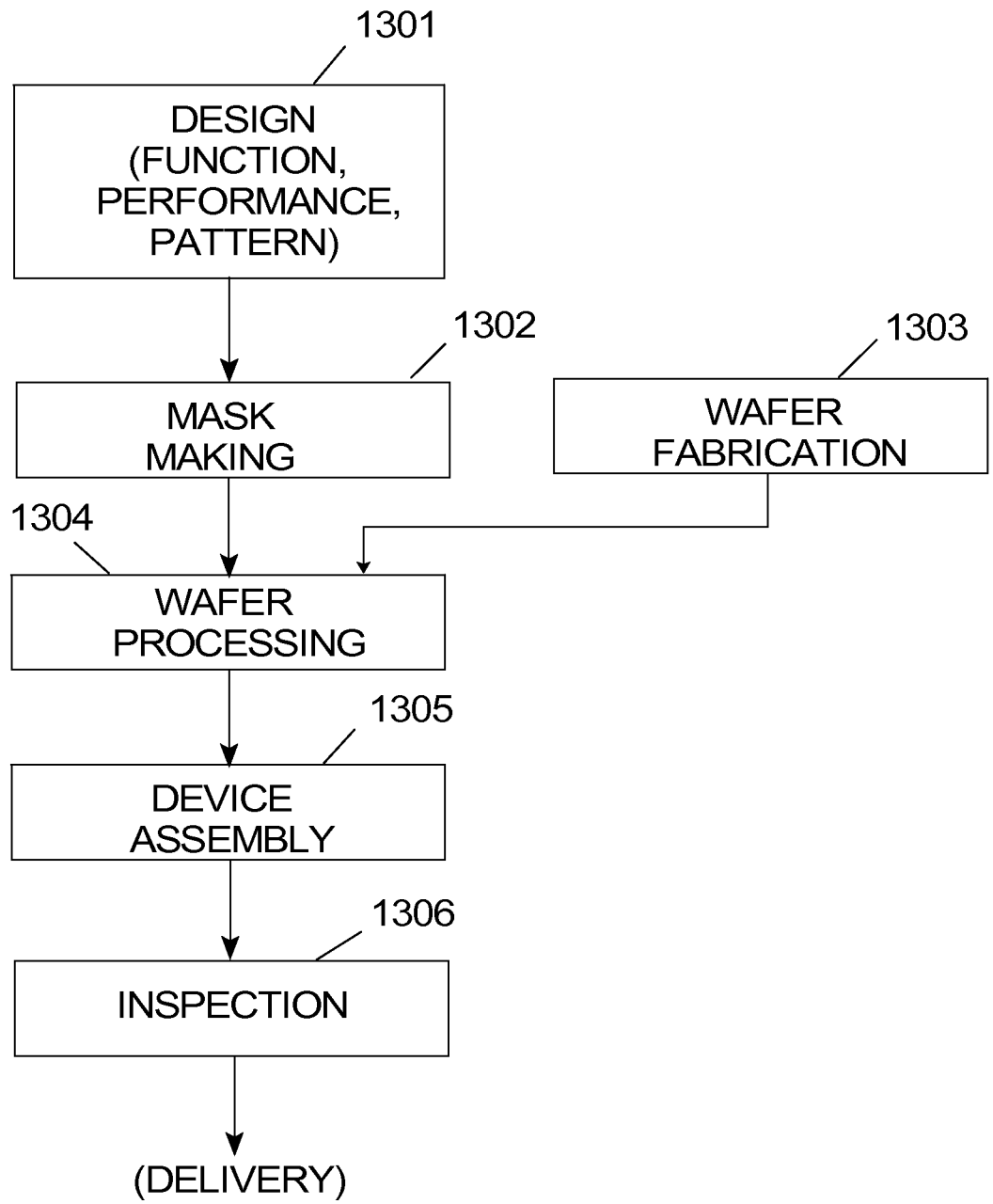
FIG. 13A is a flow chart that outlines a process for manufacturing a device in accordance with the present invention.

LCD devices or semiconductor devices can be fabricated using the above described systems, by the process shown generally in FIG. 13A. In step 1301 the device's function and performance characteristics are designed. Next, in step 1302, a mask (reticle) having a pattern is designed according to the previous designing step, and in a parallel step 1303 a substrate is made. The mask pattern designed in step 1302 is exposed onto the substrate from step 1303 in step 1304 by a photolithography system described hereinabove in accordance with the present invention. In step 1305 the LCD device or semiconductor device is assembled (including the dicing process, bonding process and packaging process), finally, the device is then inspected in step 1306.

Figure 13B:
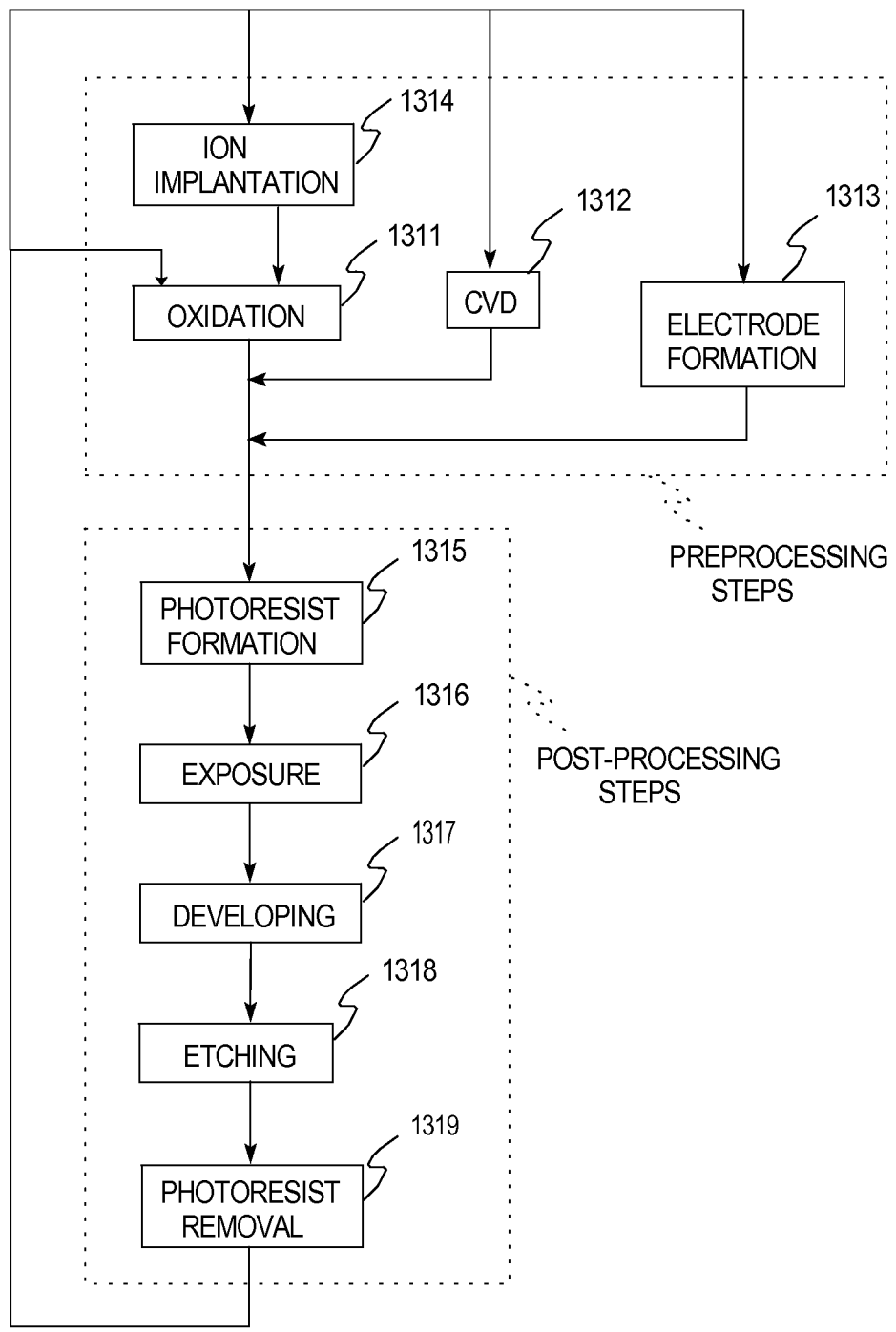
FIG. 13B is a flow chart that outlines device processing in more detail.

FIG. 13B illustrates a detailed flowchart example of the above-mentioned step 1304 in the case of fabricating LCD devices or semiconductor devices. In FIG. 13B, in step 1311 (oxidation step), the substrate surface is oxidized. In step 1312 (CVD step), an insulation film is formed on the substrate surface. In step 1313 (electrode formation step), electrodes are formed on the substrate by vapor deposition. In step 1314 (ion implantation step), ions are implanted in the substrate. The above mentioned steps 1311-1314 form the preprocessing steps for LCD devices or semiconductor wafers during processing, and selection is made at each step according to processing requirements.

At each stage of processing, when the above-mentioned preprocessing steps have been completed, the following post-processing steps are implemented. During post-processing, first, in step 1315 (photoresist formation step), photoresist is applied to a substrate. Next, in step 1316 (exposure step), the above-mentioned exposure device is used to transfer the circuit pattern of a mask (reticle) to a substrate. Then in step 1317 (developing step), the exposed substrate is developed, and in step 1318 (etching step), parts other than residual photoresist (exposed material surface) are removed by etching. In step 1319 (photoresist removal step), unnecessary photoresist remaining after etching is removed.

Multiple circuit patterns are formed by repetition of these preprocessing and post-processing steps.

While a number of exemplary aspects and embodiments of a chamber assembly have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A chamber assembly for providing a sealed chamber adjacent to a workpiece, the chamber assembly comprising:
   a chamber housing positioned adjacent to and spaced apart a chamber gap from the workpiece;
   a seal assembly that seals the chamber housing to the workpiece to create the sealed chamber between the chamber housing the workpiece, the seal assembly including a flexible barrier that is secured to the chamber housing, and a compliant seal that is secured to the flexible barrier, wherein the flexible barrier expands or contracts to adjust for changes in the chamber gap, wherein the compliant seal directly contacts the workpiece to seal against the workpiece conforming to non-uniformities in the workpiece, and wherein the flexible barrier and the compliant seal cooperate to seal the chamber gap; and
   a transducer assembly in fluid communication with the sealed chamber, the transducer assembly expanding or contracting as needed to compensate for pressure variations in the sealed chamber due to leaks or injections, thereby stabilizing the pressure in the sealed chamber, the transducer assembly including a variable chamber that alternatively expands and contracts.

2. The chamber assembly of claim 1 wherein the transducer assembly includes a flexible barrier that forms at least a portion of the variable chamber, the flexible barrier comprising a plurality of alternating concave and convex folds with components in both vertical and tangential circumferential directions.

3. The flexible barrier of claim 2 wherein the folds cooperate to be stiff along a first axis, along a second axis, and about a third axis, and flexible along the third axis, about the first axis, and about the second axis; wherein the second axis is orthogonal to the first axis and the third axis; and wherein the third axis is orthogonal to the first axis.

4. The flexible barrier of claim 2 wherein the folds are flexible vertically.

5. The chamber assembly of claim 1 further comprising a pressure source in fluid communication with the chamber housing for controlling a chamber pressure within the chamber housing, the pressure source directing a fluid through a fluid passageway to control the pressure adjacent to the workpiece.

6. A stage assembly including a stage that supports and moves the workpiece, and the chamber assembly of claim 1.

7. The stage assembly of claim 6 further comprising a chamber support assembly that couples the chamber housing to the stage assembly and that supports the chamber housing above the stage assembly.

8. The chamber assembly of claim 1 wherein the transducer assembly includes a resilient member that is connected to the variable chamber.

9. The chamber assembly of claim 1 wherein the flexible barrier comprises a plurality of alternating concave and convex folds with components in both vertical and tangential circumferential directions.

10. The chamber assembly of claim 1 further comprising a pressure source that actively controls a chamber pressure in the sealed chamber to be different than an environmental pressure of an environment surrounding the chamber assembly.

11. A chamber assembly for providing a sealed chamber adjacent to a workpiece, the chamber assembly comprising:
    a chamber housing positioned adjacent to the workpiece;
    a seal assembly that seals the chamber housing to the workpiece to create the sealed chamber between the chamber housing and the workpiece; and
    a transducer assembly in fluid communication with the sealed chamber, the transducer assembly expanding or contracting as needed to compensate for pressure variations in the sealed chamber due to leaks or injections, thereby stabilizing the pressure in the sealed chamber, the transducer assembly including a flexible barrier comprising a plurality of alternating concave and convex folds with components in both vertical and tangential circumferential directions that forms at least a portion of a variable chamber that alternatively expands and contracts, and an actuator that is coupled to and selectively moves a portion of the flexible barrier to selectively expand and contract the variable chamber.

12. The chamber assembly of claim 11 wherein the chamber housing is positioned spaced apart a chamber gap from the workpiece; and wherein the seal assembly includes a second flexible barrier that is secured to the chamber housing, and a compliant seal that is secured to the second flexible barrier, wherein the second flexible barrier expands or contracts to adjust for changes in the chamber gap, wherein the compliant seal directly contacts the workpiece to seal against the workpiece conforming to non-uniformities in the workpiece, and wherein the second flexible barrier and the compliant seal cooperate to seal the chamber gap.

13. The chamber assembly of claim 11 further comprising a pressure source in fluid communication with the chamber housing for controlling a chamber pressure within the chamber housing, the pressure source directing a fluid through a fluid passageway to control the pressure adjacent to the workpiece.

14. A stage assembly including a stage that supports and moves the workpiece, and the chamber assembly of claim 11.

15. A chamber assembly for providing a sealed chamber adjacent to a workpiece, the chamber assembly comprising:
a chamber housing positioned adjacent to the workpiece;
a seal assembly that seals the chamber housing to the workpiece to create the sealed chamber between the chamber housing and the workpiece; and
a transducer assembly in fluid communication with the sealed chamber, the transducer assembly expanding or contracting as needed to compensate for pressure variations in the sealed chamber due to leaks or injections, thereby stabilizing the pressure in the sealed chamber, the transducer assembly including a variable chamber that alternatively expands and contracts, and an actuator that is coupled to and selectively moves a portion of the variable chamber to selectively expand and contract the variable chamber.

16. The chamber assembly of claim 15 wherein the chamber housing is positioned spaced apart a chamber gap from the workpiece; and wherein the seal assembly includes a second flexible barrier that is secured to the chamber housing, and a compliant seal that is secured to the second flexible barrier, wherein the second flexible barrier expands or contracts to adjust for changes in the chamber gap, wherein the compliant seal directly contacts the workpiece to seal against the workpiece conforming to non-uniformities in the workpiece, and wherein the second flexible barrier and the compliant seal cooperate to seal the chamber gap.

17. The chamber assembly of claim 15 further comprising a pressure source in fluid communication with the chamber housing for controlling a chamber pressure within the chamber housing, the pressure source directing a fluid through a fluid passageway to control the pressure adjacent to the workpiece.

18. A stage assembly including a stage that supports and moves the workpiece, and the chamber assembly of claim 15.

19. An exposure apparatus for transferring a pattern onto a substrate, the exposure apparatus comprising:
a mask that includes the pattern;
an illumination system that directs an illumination beam at the mask; and
a stage assembly that moves the mask relative to the illumination system, the stage assembly including (i) a stage that retains the mask, and (ii) a chamber assembly for providing a sealed chamber adjacent to the mask to maintain the shape of the mask, the chamber assembly including:
a chamber housing positioned adjacent to the mask;
a seal assembly that seals the chamber housing to the mask to create the sealed chamber between the chamber housing and the mask; and
a transducer assembly in fluid communication with the sealed chamber, the transducer assembly expanding or contracting as needed to compensate for pressure variations in the sealed chamber due to leaks or injections, thereby stabilizing the pressure in the sealed chamber to maintain the shape of the mask, the transducer assembly including a variable chamber that alternatively expands and contracts.

* * * * *